(12) United States Patent
Zortea et al.

(10) Patent No.: US 11,742,869 B2
(45) Date of Patent: Aug. 29, 2023

(54) ANALOG-TO-DIGITAL CONVERTER TO IDENTIFY PROPERTIES OF TRANSMITTED SIGNALS

(71) Applicant: Mellanox Technologies, Ltd., Yokneam (IL)

(72) Inventors: Anthony Eugene Zortea, Pipersville, PA (US); Hananel Faig, Jerusalem (IL); Boris Sharav, Yokneam (IL); Mor Goren, Rishon LeZion (IL); Alik Gorshtein, Ashdod (IL); Nir Sheffi, Yokneam (IL)

(73) Assignee: Mellanox Technologies, Ltd., Yokneam (IL)

( * ) Notice: Subject to any disclaimer, the term of this patent is extended or adjusted under 35 U.S.C. 154(b) by 65 days.

(21) Appl. No.: 17/573,212

(22) Filed: Jan. 11, 2022

(65) Prior Publication Data

US 2023/0223946 A1 Jul. 13, 2023

(51) Int. Cl.
*H03M 1/06* (2006.01)
*H03M 1/10* (2006.01)

(52) U.S. Cl.
CPC ....... *H03M 1/0624* (2013.01); *H03M 1/1023* (2013.01)

(58) Field of Classification Search
CPC .......................... H03M 1/0624; H03M 1/1023
USPC ........................................................ 341/144
See application file for complete search history.

(56) References Cited

U.S. PATENT DOCUMENTS 9,685,969 B1 * 6/2017 Garg ...................... H03M 1/66
10,461,764 B1 * 10/2019 Paro Filho .......... H03M 1/1033

OTHER PUBLICATIONS

Faig et al., "A Novel CDR-Based Low-Cost Time-Interleaved-ADC Timing Calibration", Journal of Lightwave Technology, vol. 38, No. 7, Apr. 1, 2020, 8 pages.

* cited by examiner

*Primary Examiner* — Khai M Nguyen
(74) *Attorney, Agent, or Firm* — Lowenstein Sandler LLP

(57) ABSTRACT

A transmitter including a digital-to-analog converter (DAC) to generate an analog output corresponding to a transmitted signal. The transmitter further includes an analog-to-digital converter (ADC) coupled to the DAC. The ADC measures the analog output of the DAC to identify a set of digital samples. The ADC identifies, from the set of digital samples, a set of valid samples, wherein each valid sample has a voltage within a voltage range. The ADC extracts one or more signal properties from the set of valid samples.

20 Claims, 18 Drawing Sheets

┌─────────────────────────────────────────────────────┐
│  Measure, by a virtual analog-to-digital converter  │
│  (VADC) coupled to a digital-to-analog converter    │
│  (DAC), an analog output of the DAC to identify a   │
│  set of digital samples corresponding to a          │
│  transmitted signal                                 │
│                        910                          │
└─────────────────────────────────────────────────────┘
                          │
┌─────────────────────────────────────────────────────┐
│  Identify, from the set of digital samples, a set   │
│  of valid samples, where each valid sample has a    │
│  voltage within a voltage range                     │
│                        920                          │
└─────────────────────────────────────────────────────┘
                          │
┌─────────────────────────────────────────────────────┐
│  Extract one or more signal properties from the set │
│  of valid samples                                   │
│                        930                          │
└─────────────────────────────────────────────────────┘
```

| Bin | Delay |
|---|---|
| 0 | 0 |
| 1 | -1 |
| 2 | -2 |
| 3 | -3 |
| 4 | 4/-4 |
| 5 | 3 |
| 6 | 2 |
| 7 | 1 |

ANALOG-TO-DIGITAL CONVERTER TO IDENTIFY PROPERTIES OF TRANSMITTED SIGNALS

TECHNICAL FIELD

At least one embodiment pertains to processing resources used to perform high-speed communications. For example, at least one embodiment pertains to technology for an analog-to-digital converter (ADC) to sample a high-speed signal to identify valid samples having a voltage within a threshold voltage range to identify one or more signal properties that can be used for further digital signal processing including offset, gain and timing calibration.

BACKGROUND

Communications systems transmit and receive signals at a high data rate (e.g., up to 200 Gbits/sec). High-speed transmissions exhibit significant noise attributes (e.g., due to the transmission medium) that require the use of communication devices (e.g., transmitters and receivers) configured to perform digital pre-processing by the transmitter device and post-processing by the receiver device. To convert from the digital to analog domains and from the analog to digital domains, digital-to-analog converters (DAC) and analog-to-digital converters (ADC) are used. The employed DACs and ADCs are configured to operate at a particular data rate (i.e., an operation rate) at a very high analog bandwidth.

A typical DAC includes multiple sub-converters (also referred to as "sub-DACs") that each generates a slower analog sub-signal. The use of multiple sub-DACs results in the need to address various calibration issues including time-interleaving (TI) skew calibration, thermal calibration, digital pre-distortion, etc. For example, to implement high-accuracy, high-speed and high-bandwidth conversion, a TI-skew calibration architecture is commonly be used. The TI architecture can be used to time-interleave the multiple sub-DACS into the high-speed DAC, where each sub-DAC has a different phase that is multiplexed to generate the high-speed DAC signal. However, in a typical TI architecture, the differences and skews between sub-converters of the DACs and ADCs reduce the conversion accuracy and harm the signal quality and end-to-end performance of the communication system.

To mitigate the TI-skews between sub-converters, the converters are calibrated using a calibration process based on samples of the analog signal to calibrate the gain, offset, and timing differences of the sub-DACs. While the ADC calibration flow is based on the samples from the ADC output, the DAC calibration flow is more complicated. In particular, in a typical DAC calibration flow, conversion results in an analog signal that is to be sampled again for the calibration flow. It is desirable to calibrate the transmitted signal based on the output signal of the high-speed DAC. The time-interleaving is used to synchronize the signals of the sub-DACs, which operate at a slower rate than the desired global rate of the high-speed DAC. Calibration may be used to adjust the behavior of all of the sub-DACs, but requires estimates of the offset and gain of each sub-DAC to achieve the necessary calibration (i.e., estimations of the offset and gain of each sub-DAC are needed to achieve a same offset and gain).

One common approach for TI-DAC calibration includes the use of an ADC at the transmit side of the communication system. However, the use of an ADC on the transmit side is disadvantageous since it increases both the cost and complexity of the transmitter device. Furthermore, this approach includes the use of an "intermediate" output signal for calibration, and not the final output of the high-speed DAC. In addition, this approach requires the use of special test signals configured for calibrating the transmitted signal. Generation of the special test signals results in a loss of time and workload consumption. Moreover, the processing of the test signals is not done in the background, but instead involves the use of the special test signal (e.g., a clock) with certain measurable properties that can be calibrated.

Another approach for TI-DAC calibration relies on the use of feedback information received by a transmitter from a receiver. In this approach, the DAC calibrations are implemented in the receive-side, and the calibration instructions are transmitted back to the transmit-side. However, this approach suffers from effects mixing and is not supported by various communication standards.

Accordingly, there is a need for a cost-effective approach to enable calibration (e.g., TI-DAC calibration) of a transmitted signal in a communication system.

BRIEF DESCRIPTION OF DRAWINGS

Various embodiments in accordance with the present disclosure will be described with reference to the drawings, in which:

FIG. 9 is a flow diagram of a method of extracting one or more properties of a transmitted signal from a set of valid samples identified by a VADC of a transmitter device in a communication system, in accordance with at least some embodiments.

DETAILED DESCRIPTION

Figure 1A:
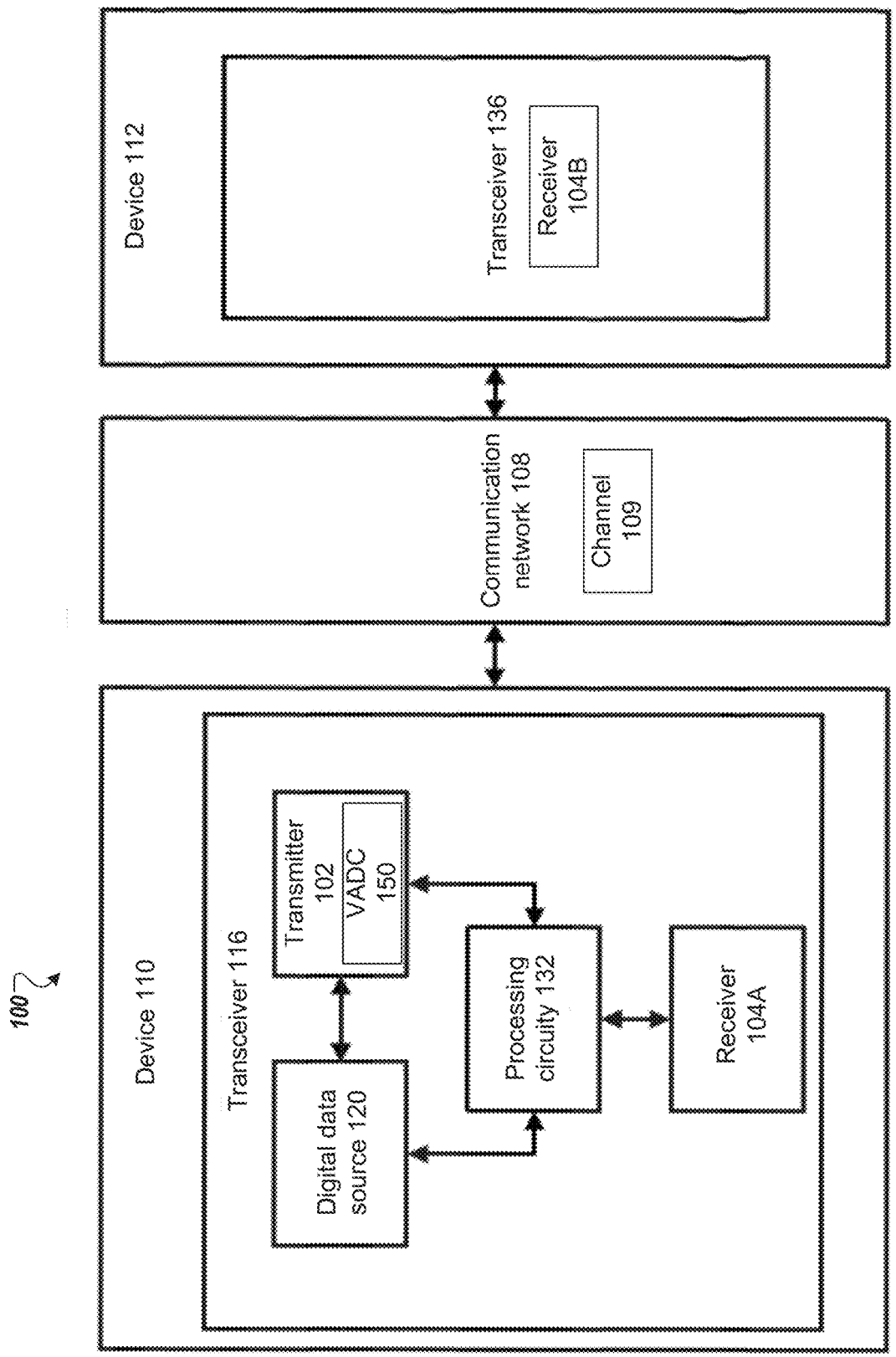
FIG. 1A illustrates an example communication system, in accordance with at least some embodiments.

As described above, various types of calibration of a high-speed analog component (e.g., a high-speed DAC) including TI-skew calibration, thermal calibration, digital pre-distortion calibration, etc. may be needed. For example, typical TI-skew calibration can not be performed by typical time-interleaving architectures that employ an ADC on the transmit-side of a communication system or rely on feedback from the receive-side to calibrate the DAC output signal. Advantageously, aspects of the present disclosure are directed to a digital sampler module, also referred to as a "virtual ADC" (herein "VADC"), configured to measure an analog output of a DAC to identify a set of digital samples. The VADC identifies, from the set of digital samples, a set of "valid" samples from which one or more signal properties are extracted. According to embodiments, the signal properties can include, but are not limited to, statistical properties of the signal determined based on the valid samples, such as a first moment, a second moment, cross-correlation with a reference signal, auto-correlation, etc. A valid sample is a digital sample of the analog output that has a voltage within a voltage range (also referred to as a "threshold voltage range"). The voltage range can be defined by a first threshold voltage level (also referred to as "reference voltage 1" or "Vthreshold 1") and a second threshold voltage level (also referred to as a "reference voltage 2" or "Vthreshold 2" that are generated by the VADC.

In an embodiment, the VADC is based on a 1-bit ADC with configurable threshold voltage levels (e.g., user-configurable threshold voltage levels or system-configurable threshold voltage levels) of the applicable voltage range used to identify the set of valid samples. In an embodiment, the VADC samples the output signal of the DAC at a target operation rate and identifies each sample as either "valid" (i.e., having a voltage within the threshold voltage range) or "invalid" (i.e., having an unknown voltage or having a voltage that is not within the threshold voltage range). In an embodiment, a portion of the signal between Vthreshold 1 and Vthreshold 2 has a value that is known and valid. In an embodiment, the VADC provides cost-efficient high-bandwidth analog-to-digital conversion to identify valid samples from which one or more signal properties can be extracted for use in subsequent digital signal processing (DSP) algorithms. According to embodiments, the VADC includes an internal clock delay, and can be tuned to any desired phase such that the set of valid samples can be taken or identified at any phase of the output signal of the transmitter. According to embodiments, different voltage ranges can be applied to identify valid samples at different times. For example, a first voltage range can be applied at a first time, a second or further voltage range (i.e., where the further voltage range is different than the first voltage range) can be applied at a second time, and so on.

In an embodiment, the set of invalid samples can be dropped or discarded from further processing, with penalty of colored noise whitening. In an embodiment, the VADC provides high-accuracy with lower operation rate sampling to identify one or more signal properties from the valid samples for use in one or more additional of DSP algorithms including, for example, calibration algorithms including a TI calibration algorithm, a thermal calibration algorithm, a digital pre-distortion algorithm, a system characterization algorithm, an independent additional sampling phase algorithm, etc.

In an embodiment, the VADC can adjust, set, or establish the voltage range (e.g., Vthreshold 1 and Vthreshold 2) based on historical or previous data relating to the output signal of the transmitter. In an embodiment, the historical data associated with the output signal can be based on previous scans performed by the VADC or an offline analysis of the output signal) that enables the identification of threshold values that are optimized to yield a greater number of valid samples. The tuning, adjusting, and setting of the threshold values of the voltage range based on historical signal data enables the scanning process of the VADC to operate at a faster speed by identifying areas of high signal density in the amplitude domain. By optimizing the threshold values to identify the high-density areas, less time is spent by the VADC scanning in the low-density areas, which increases the speed of the overall scan performed by the VADC.

FIG. 1A illustrates an example communication system 100 according to at least one example embodiment. The system 100 includes a device 110, a communication network 108 including a communication channel 109, and a device 112. In at least one example embodiment, devices 110 and 112 correspond to one or more of a Personal Computer (PC), a laptop, a tablet, a smartphone, a server, a collection of servers, or the like. In some embodiments, the devices 110 and 112 may correspond to any appropriate type of device that communicates with other devices also connected to a common type of communication network 108. According to embodiments, the receiver 104A, 104B of devices 110 or 112 may correspond to a graphics processing unit (GPU), a switch (e.g., a high-speed network switch), a network adapter, a central processing unit (CPU), etc. As another specific but non-limiting example, the devices 110 and 112 may correspond to servers offering information resources, services and/or applications to user devices, client devices, or other hosts in the system 100.

Examples of the communication network 108 that may be used to connect the devices 110 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables data transmission between the devices 110 and 112 using data signals (e.g., digital, optical, wireless signals).

The device 110 includes a transceiver 116 for sending and receiving signals, for example, data signals. The data signals may be digital or optical signals modulated with data or other suitable signals for carrying data.

The transceiver 116 may include a digital data source 120, a transmitter 102, a receiver 104A, and processing circuitry 132 that controls the transceiver 116. The digital data source 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 102 includes suitable software and/or hardware for receiving digital data from the digital data source 120 and outputting data signals according to the digital data for transmission over the communication network 108 to a receiver 104B of device 112. In an embodiment, the transmitter 102 includes a VADC 150. Additional details of the structure of the transmitter 102 and VADC 150 are discussed in more detail below with reference to the figures.

The receiver 104A, 104B of device 110 and device 112 may include suitable hardware and/or software for receiving signals, for example, data signals from the communication network 108. For example, the receivers 104A, 104B may include components for receiving processing signals to extract the data for storing in a memory.

The processing circuitry 132 may comprise software, hardware, or a combination thereof. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control the overall operation of the transceiver 116.

The transceiver 116 or selected elements of the transceiver 116 may take the form of a pluggable card or controller for the device 110. For example, the transceiver 116 or selected elements of the transceiver 116 may be implemented on a network interface card (NIC).

The device 112 may include a transceiver 136 for sending and receiving signals, for example, data signals over a channel 109 of the communication network 108. The same or similar structure of the transceiver 116 may be applied to transceiver 136, and thus, the structure of transceiver 136 is not described separately.

Although not explicitly shown, it should be appreciated that devices 110 and 112 and the transceivers 116 and 136 may include other processing devices, storage devices, and/or communication interfaces generally associated with computing tasks, such as sending and receiving data.

Figure 1B:
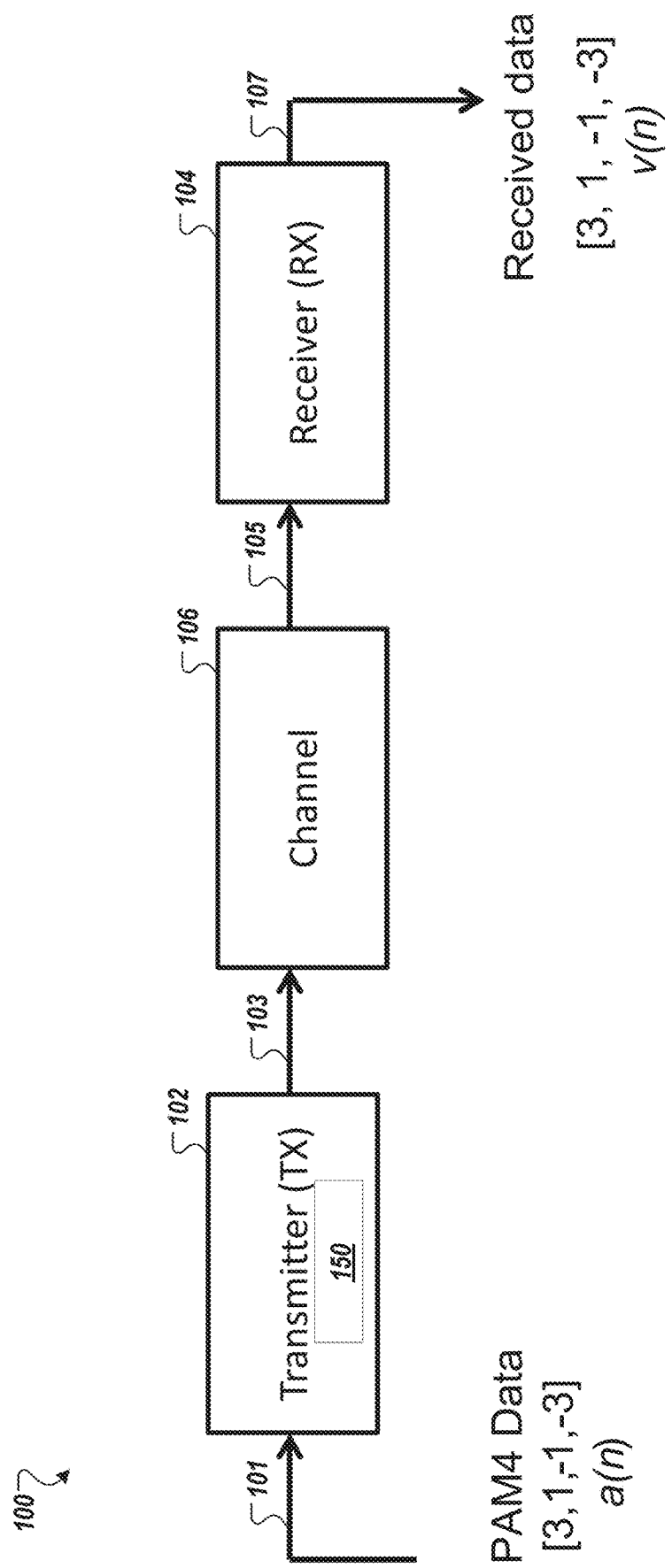
FIG. 1B illustrates a block diagram of an exemplary communication system employing an example modulation scheme, in accordance with at least some embodiments.

FIG. 1B illustrates a block diagram of an exemplary communication system 100 employing an example PAM modulation scheme. In the example shown in FIG. 1, a PAM level-4 (PAM4) modulation scheme is employed with respect to the transmission of a signal (e.g., digitally encoded data) from a transmitter (TX) 102 to a receiver (RX) 104 via a communication channel 106 (e.g., a transmission medium). In this example, the transmitter 102 receives 101 an input data (i.e., the input data at time n is represented as "a(n)"), which is modulated in accordance with a modulation scheme (e.g., PAM4) and sends 103 the signal a(n) including a set of data symbols (e.g., symbols −3, −1, 1, 3, wherein the symbols represent coded binary data). It is noted that while the use of the PAM4 modulation scheme is described herein by way of example, other data modulation schemes can be used in accordance with embodiments of the present disclosure, including for example, a non-return-to-zero (NRZ) modulation scheme, PAM8, PAM16, etc. For example, for a non-return to zero (NRZ)-based system, the transmitted data symbols consist of symbols −1 and 1, with each symbol value representing a binary bit. This is also known as a PAM level-2 or PAM2 system as there are 2 unique values of transmitted symbols. Typically a binary bit 0 is encoded as −1, and a bit 1 is encoded as 1 as the PAM2 values.

In the example shown, the PAM4 modulation scheme uses four (4) unique values of transmitted symbols to achieve higher efficiency and performance. The four levels are denoted by symbol values −3, −1, 1, 3, with each symbol representing a corresponding unique combination of binary bits (e.g., 00, 01, 10, 11).

The communication channel 106 is a destructive medium in that the channel acts as a low pass filter which attenuates higher frequencies more than it attenuates lower frequencies and introduces inter-symbol interference (ISI). The communication channel 106 can be over serial links (e.g., a cable, printed circuit boards (PCBs) traces, copper cables, optical fibers, or the like), read channels for data storage (e.g., hard disk, flash solid-state drives (SSDs), high-speed serial links, deep space satellite communication channels, applications, or the like.

The transmitter (TX) 102 includes a VADC 150, which is a circuit configured to receive an analog output of a DAC and identify "valid" samples in a digital domain. In an embodiment, the VADC 150 measures the analog output of the DAC to identify a set of digital samples and identifies the valid samples having a voltage level within a threshold voltage range. The VADC 150 extracts one or more signal properties from the set of valid samples. The VADC 150 provides the one or more signal properties to digital logic configured to execute one or more digital signal processing algorithms (e.g., a calibration algorithm configured to calibrate an output signal (i.e., the transmitted signal) sent 103 by the transmitter 102) based on the one or more signal properties identified by the VADC 150.

Figure 2:
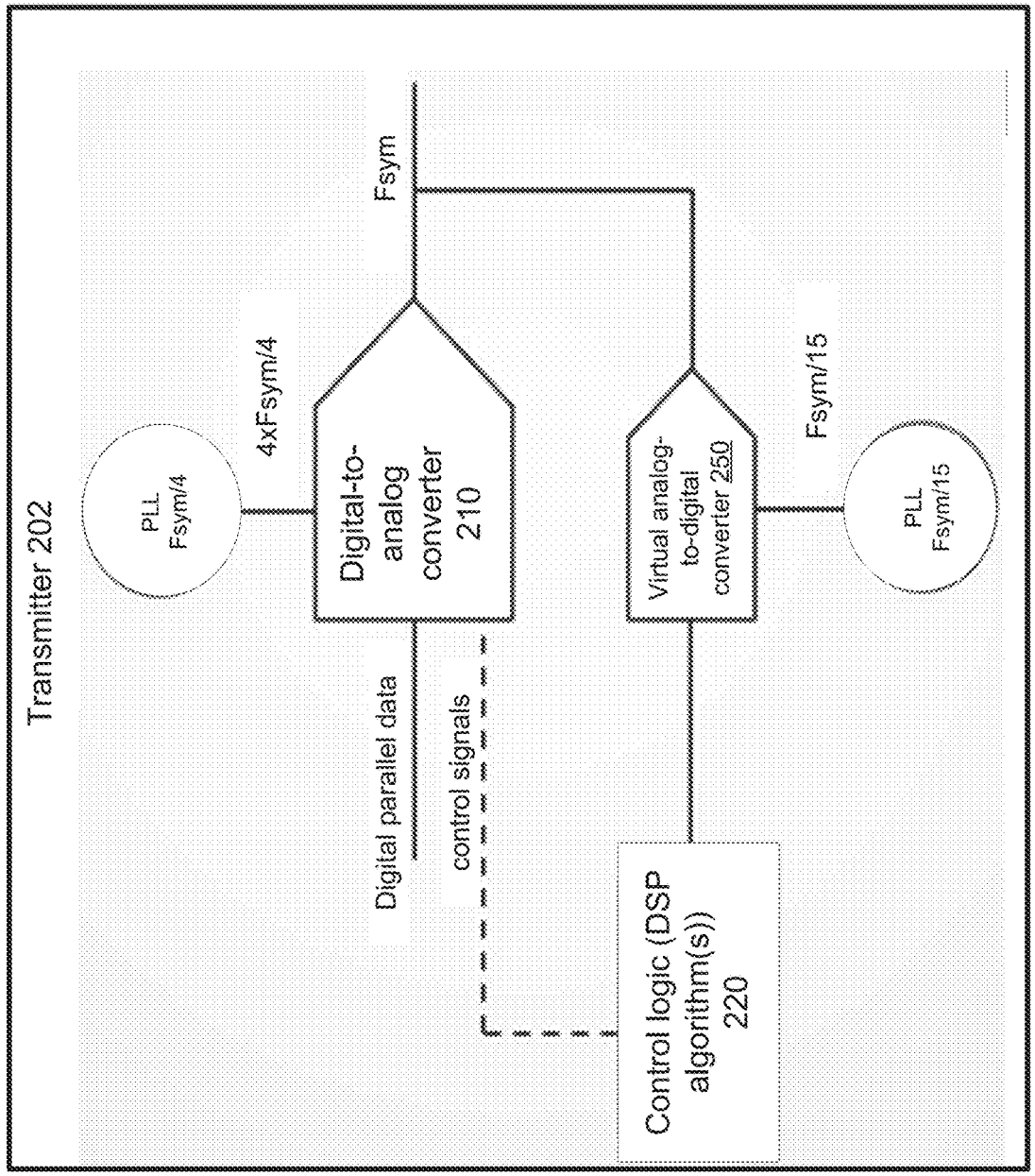
FIG. 2 illustrates an example transmitter device including a "virtual" analog-to-digital (VADC) to identify one or more valid digital samples of a transmitted signal, in accordance with at least some embodiments.

FIG. 2 illustrates an example transmitter 202 including a VADC 250 configured to identify one or more valid digital samples of a transmitted signal based on an output of a digital-to-analog converter (DAC) 210, in accordance with at least some embodiments. The VADC 250 samples a high-speed output signal generated by the DAC 210 of the transmitter 202 at a low transmission rate and high bandwidth. The VADC 250 identifies valid samples that satisfy a condition. In an embodiment, a sample is identified by the VADC 250 as "valid" in response to determining that the sample has a voltage that is within a threshold voltage range (i.e., satisfies the condition). In an embodiment, the valid samples identified by the VADC 250 are reconstructed and correlated to the transmitted signal to enable the execution of one or more DSP algorithms by control logic 220. In an embodiment, the one or more DSP algorithms can include algorithms to calibrate one or more of an offset, gain and timing of the sub-converters (i.e., sub-DACs) of the DAC 210. In an embodiment, the one or more DSP algorithms executed by the control logic 220 can identify and address gain, offset and timing errors that occur due to mismatch between the sub-DACs of DAC 210 or phase locked loop (PLL) phases. In an embodiment, the PLL is a circuit configured to generate and distribute the quadrature clocks to the transmitter 202. Advantageously, the VADC 250 extracts one or more signal properties from the valid samples that are provided to the control logic 220 for use in the execution of the one or more DSP algorithms.

As shown in FIG. 2, the transmitter 202 is configured to transmit data at a first symbol frequency (Fsym). For example, the first symbol frequency (Fsym) of the transmitter 202 is approximately a 56Gsym/sec rate. In an embodiment, the transmitter 202 is driven by multiple quadrature clocks (e.g., 4 clocks) with phase spacing of 1 unit interval (UI) or symbol time (e.g., UI=1/Fsym). The transmitter 202 can be implemented with multiple sub-DACs (e.g., 4 sub-DACs), which each operate at 0.25*Fsym, and the respective sub-DAC outputs are multiplexed to the full data rate (Fsym) at the output of the transmitter 202.

In an embodiment, the VADC 250 is configured to collect data at a lower rate (e.g., Fsym/15) at a high bandwidth. Since each sub-DAC transmits at Fsym/4 and the VADC 250 samples the output at Fsym/15, each four (4) consecutive VADC samples are associated with different sub-DACs. The VADC 250 samples the data from the DAC 210 output and provides the signal properties associated with the valid samples to the control logic 220 that provides control signals to control the DAC based on the one or more DSP algorithms. In an embodiment, the control signals may relate to the calibration of one or more characteristics (e.g., offset, gain, timing, etc.) of the transmitted signal. In an embodiment, a DSP algorithm can be executed based on the signal properties associated with the valid signal to converge to a state where the control loop is stable, and the transmitted signal is calibrated. For example, the DSP algorithms can include one or more of a TI-calibration processing, a system characterization processing, independent sampling phase processing, etc.

Figure 3:
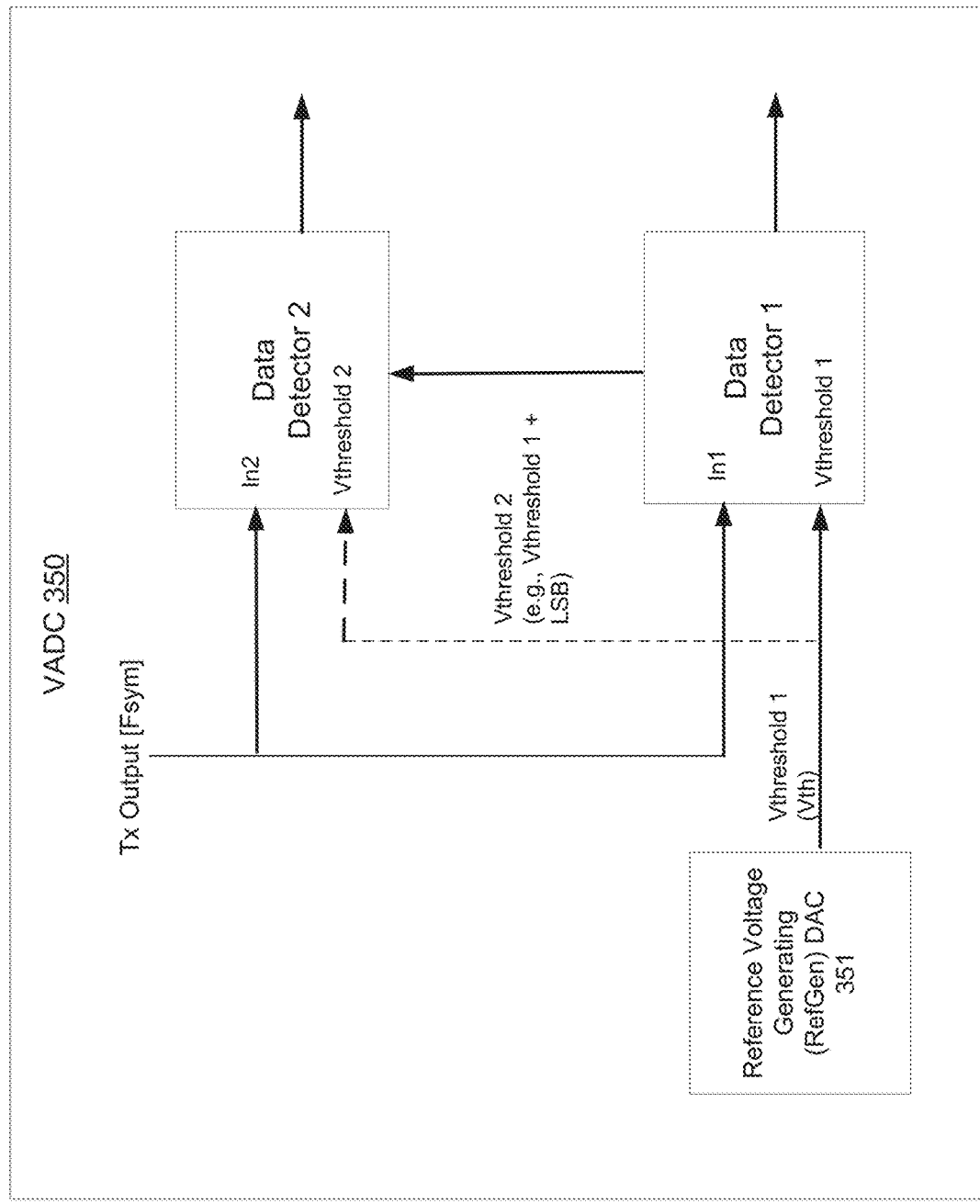
FIG. 3 illustrates an example VADC including a reference voltage generating DAC to generate a threshold voltage range for use in identifying one or more valid samples of a transmitted signal, in accordance with at least some embodiments.

FIG. 3 illustrates an example VADC 350 including a reference voltage generating DAC 351 to generate a threshold voltage range for use in identifying one or more valid samples of a transmitted signal, in accordance with at least some embodiments. In an embodiment, the reference voltage generating DAC 351 (also referred to as "RefGen DAC" 351) generates a first threshold voltage (Vthreshold 1) and a second threshold voltage (Vthreshold 2) to define a voltage range used to identify a valid sample. In an embodiment, data detector 1 (e.g., a slicer) samples the transmitter (TX) output with respect to Vthreshold 1, and data detector 2 (e.g., a slicer) samples the TX output with respect to Vthreshold 2. In an embodiment, the RefGen 351 DAC 351 is an internal low-speed circuit that generates the first threshold voltage (Vthreshold 1) and the additional or second threshold voltage (Vthreshold 2) with a constant voltage offset (e.g., a least significant bit (LSB) offset, such that Vthreshold 2=Vthreshold 1+LSB. In an embodiment, a valid sample is observed when data detector 1 has an output of "1" and data detector 2 has an output of "0".

In an embodiment, the RefGen 351 of the VADC 350 can set the voltage values (i.e., Vthreshold 1 and Vthreshold 2) of the voltage range used to identify valid samples based on historical signal data relating to the TX output signal. According to embodiments, the historical signal data can be based on previous scanning iterations of the VADC 350 or another signal analysis algorithm performed with respect to the output signal (e.g., an offline analysis of the output signal). The RefGen 351 can use the historical data to identify threshold values that are optimized to yield a greater number of valid samples (e.g., areas of high signal density in the amplitude domain). Optimization of the threshold values by the RefGen 351 to identify the high-density areas results in less time being spent by the VADC 350 in scanning in the low-density areas, thus reducing the overall time associated with the scans performed by the VADC 350.

Figure 4:
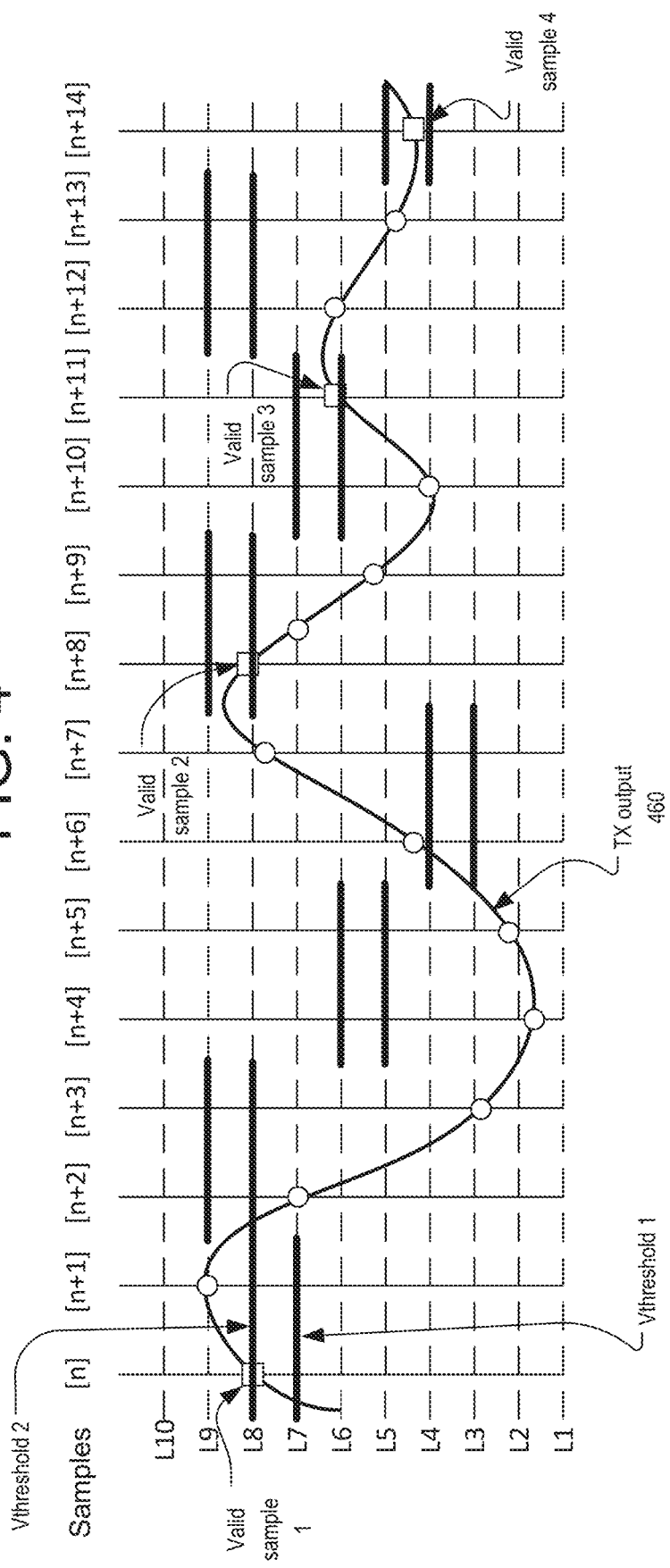
FIG. 4 illustrates an example sampling process executed by a VADC to identify one or more valid samples having a voltage within an applicable threshold voltage range, in accordance with at least some embodiments.

FIG. 4 illustrates an example sampling process executed by a VADC (e.g., VADC 150, 250, 350 of FIGS. 1A, 1B, 2, and 3) to identify one or more valid samples having a voltage within an applicable threshold voltage range, in accordance with at least some embodiments. As shown in FIG. 4, the TX output 460 is an analog signal varying with time. As shown, samples (e.g., n, n+1, n+2, n+3, etc.) of the TX output 460 can be identified by the VADC at various points in time. The VADC maintains two configurable thresholds and generates a 1-bit output representing either a "valid" or "invalid" sample. In an embodiment, a voltage range between applicable threshold voltage levels (e.g., L1, L2, L3 . . . L10) is used to determine if a given sample is "valid" (i.e., the applicable voltage range) or "invalid" (i.e., unknown or not within the applicable voltage range). In FIG. 4, valid samples are denoted by a rectangle, and invalid samples are denoted by a circle.

For example, as shown in FIG. 4, a voltage of the "n" sample is compared to a voltage range including Vthreshold 1 at level L7 and Vthreshold 2 at level L8. In this example, it is determined that the n sample has a voltage that is within the L7 to L8 range and is identified as a valid sample. In the example shown, samples n, n+8, n+11 and n+14 are identified as valid samples, while the other samples shown are identified as invalid samples. As illustrated in FIG. 4, different voltage ranges (i.e., the range between Vthreshold 1 and Vthreshold 2) can be applied at different times to identify valid samples. As shown in FIG. 4, different voltage ranges (e.g., a first voltage ranges between L7 and L8 is applied to samples n and n+1, a second or further voltage range between L8 and L9 is applied to samples n+2, and n+3), and so on. For example, as shown, sample n+7 is compared to a voltage range of voltage level 3 and voltage level 4, while sample n+10 is compared to a voltage range of voltage level 6 and voltage level 7. In an embodiment, when the TX signal crosses the "window" corresponding to the voltage range, the sample is considered valid such that the signal's value is known when in the voltage range.

Figure 5:
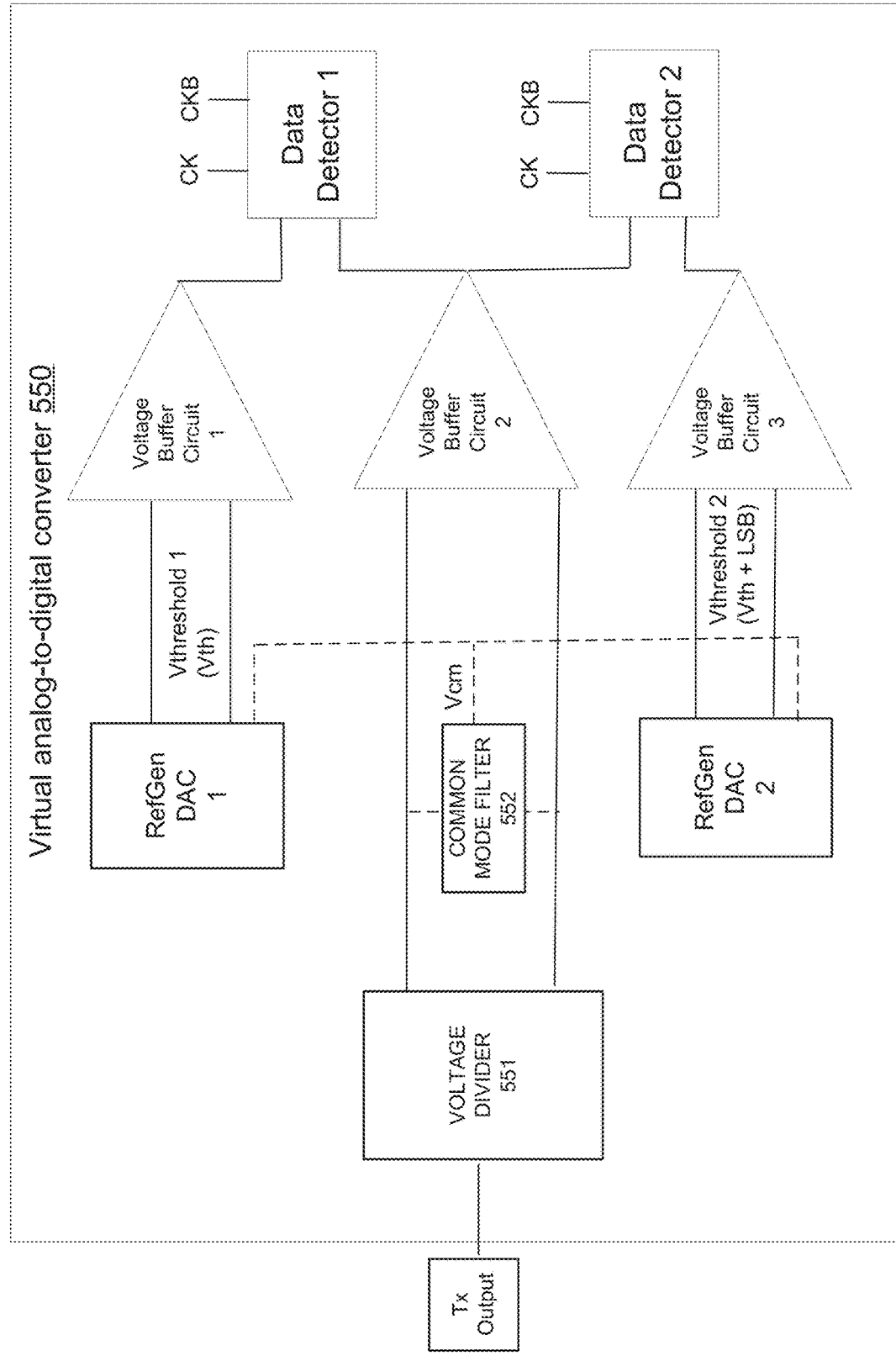
FIG. 5 is a block diagram of an example VADC, in accordance with at least some embodiments.

FIG. 5 is a block diagram of an example VADC 550, in accordance with at least some embodiments. In an embodiment, the VADC 550 is part of a transmitter device and identifies the valid samples based on the TX output. In an embodiment, the VADC 550 isolates a Fsym/15 frequency from the TX output signal. As shown in FIG. 5, the TX output is loaded by a voltage divider 551 (e.g., a resistor-based voltage divider). The signal at the output of the voltage divider 551 is applied to a voltage buffer circuit (i.e., voltage buffer circuit 2). A common mode filter 552 filters a common mode voltage (Vcm) of the signal and feeds the Vcm to RefGen DAC 1 and RefGen DAC 2. The two RefGen DACs (RefGen DAC 1 and RefGen DAC 2) generate differential threshold voltages (e.g., Vthreshold1 and Vthreshold2) around the Vcm. The top and the bottom threshold voltages of the voltage range that are generated are applied to voltage buffer circuit 1 and voltage buffer circuit 3, respectively. In an embodiment, the outputs of the voltage buffer circuit 1 and voltage buffer circuit 3 are DC reference levels and connected to Data Detector 1 and Data Detector 2 reference terminals, where the signals at the output of voltage buffer circuit 2 fed to the data detectors signal terminals are at a high bandwidth (e.g., in a range of approximately 15 GHz to 30 GHz). In an embodiment, Data Detector 1 and Data Detector 2 are triggered with complementary clocks CK/CKB. In an embodiment, a valid sample is identified in response to Data Detector 1 generating an output of "0" and Data Detector 2 generating an output of "1".

Figure 6:
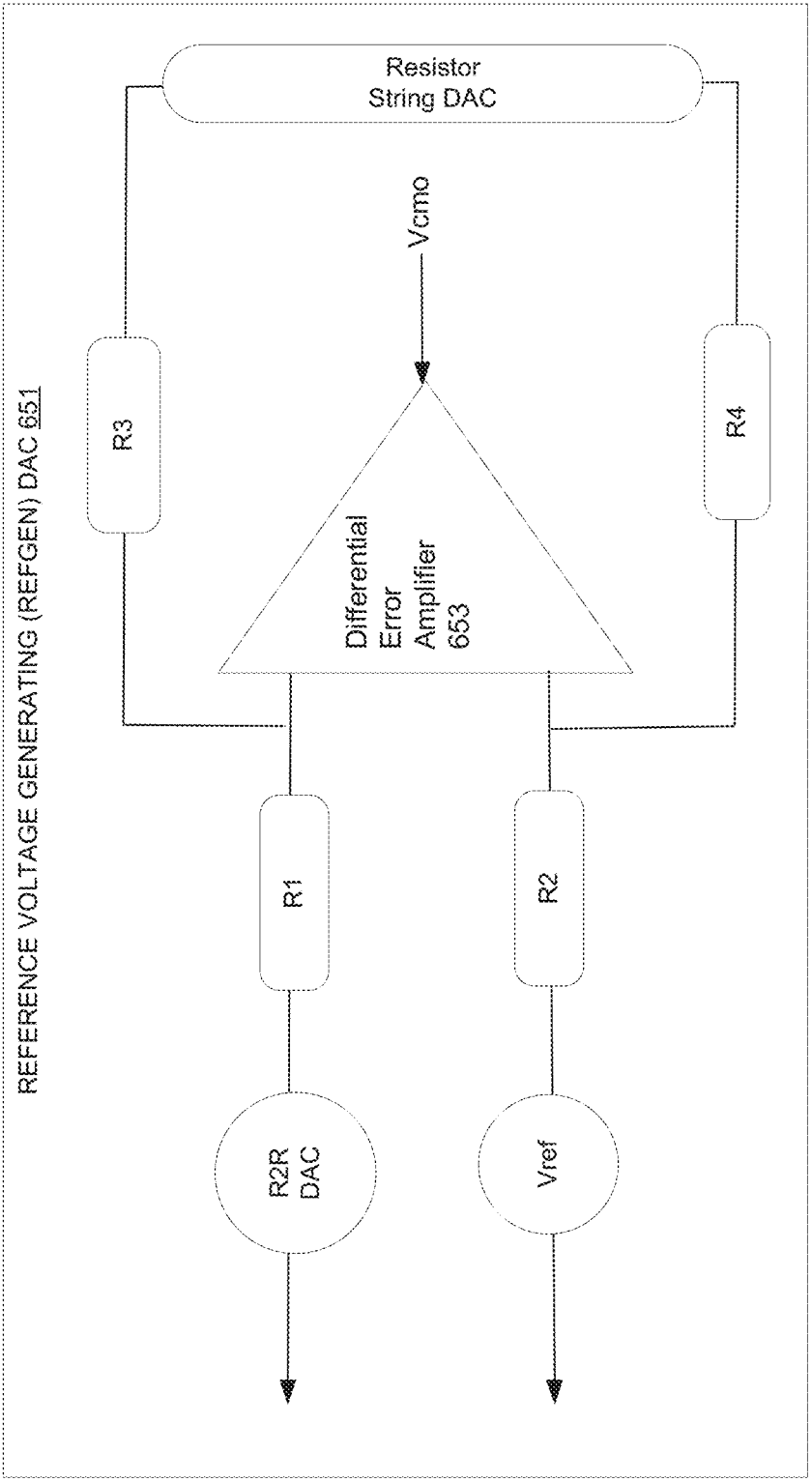
FIG. 6 is a block diagram of an example reference voltage DAC of a VADC to generate reference voltage values of a voltage range for use in identifying valid digital samples of a transmitted signal, in accordance with at least some embodiments.

FIG. 6 is a block diagram of an example reference voltage generating DAC (RefGen DAC) 651 of a VADC, in accordance with at least some embodiments. In an embodiment, the RefGen DAC 651 is configured to generate reference voltage values of a voltage range for use by the VADC in identifying valid digital samples of a transmitted signal. In an embodiment, the RefGen DAC 651 includes a comparator or differential error amplifier 653, connected to a resistor ladder (e.g., R2R) DAC at one pin and to a constant reference voltage (Vref) to another pin. In an embodiment, the R2R DAC is a voltage mode connection and interpolates all voltage range from a first voltage level (e.g., approximately 0.8V to 0.9V or VDDA) to a low voltage level (e.g., a ground voltage level or VSSA).

In an embodiment, the R2R DAC drives bit $a_{n-1}$ (e.g., a most significant bit, MSB) through bit $a_0$ (e.g., a least significant bit, LSB) from digital logic gates. In an embodiment, the bit inputs are switched between V=0 (logic 0) and V=VDDA (logic 1). The R2R DAC causes these digital bits to be weighted in their contribution to the output voltage Vout. Depending on which bits are set to 1 and which to 0 and the full scale (FS) which is set by resistors R3 and R4 (FIG. 6), the output voltage (Vout) can have a corresponding value between Vcm+FS/2 and Vcm-FS/2. For example, when all bits are "1", Vout is Vcm+FS. In another example, when all bits are "0", Vout is Vcm-FS). In an embodiment, the Vref is VDDA/2 reference with an impedance equal to that of the R2R ladder. In an embodiment, the differential error amplifier is connected in a voltage-to-current feedback configuration. In an embodiment, the output voltage is set to a desired common mode level (Vcm) and exhibits a differential amplitude of approximately 0.6*VDDA. In an embodiment, gain correction is performed by a resistor string DAC. In an embodiment, the resistor string DAC can be connected between the output terminals and implements voltage division to tune the full scale according to desired code.

Figure 7:
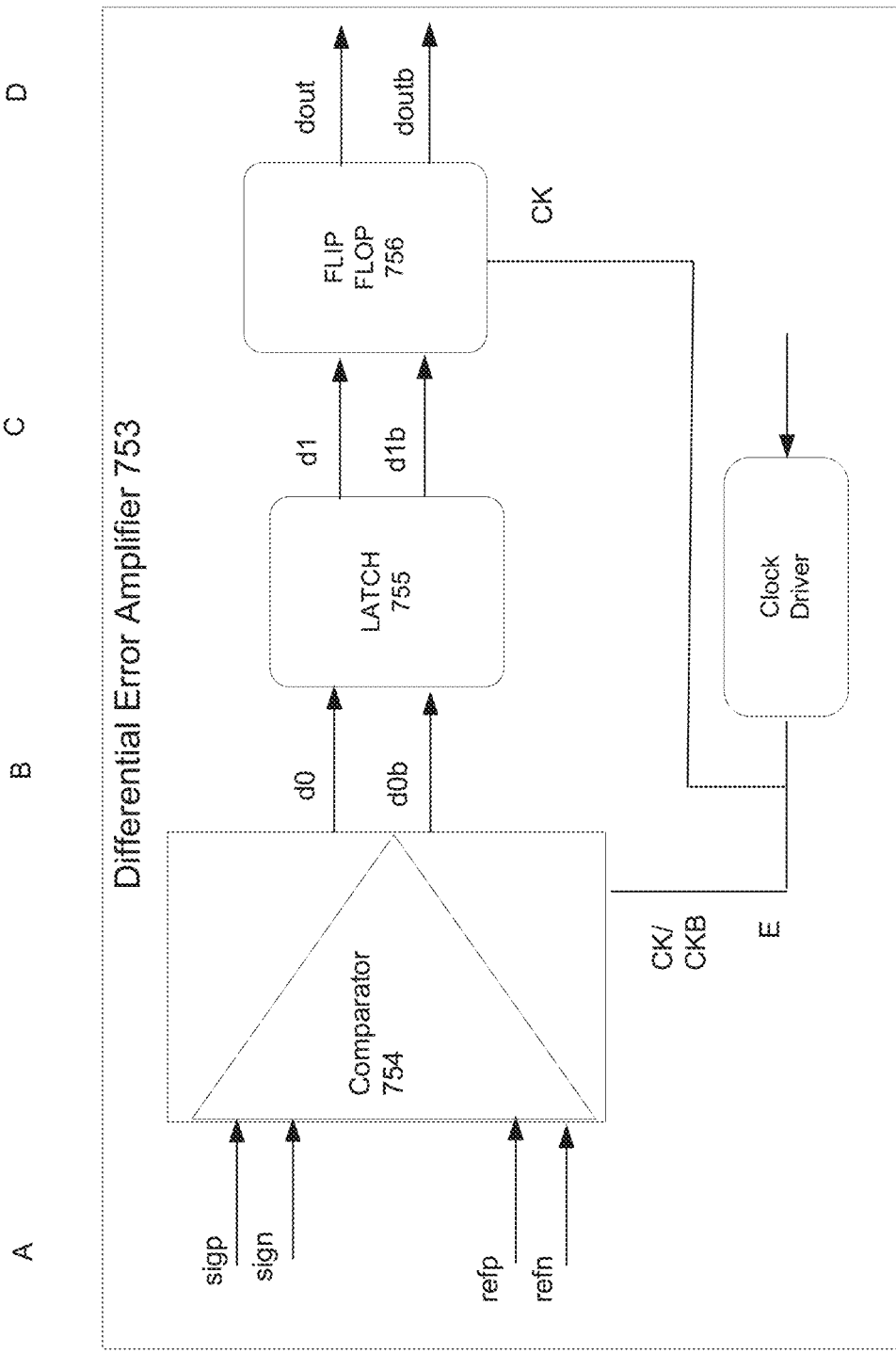
FIG. 7 is a block diagram of a comparator of a VADC including various operational stages, in accordance with at least some embodiments.

FIG. 7 is a block diagram of an example differential error amplifier of a VADC including various operational stages (e.g., stages A, B, C, D, and E), in accordance with at least some embodiments. In an embodiment, the differential error amplifier is a regenerative amplifier that resolves analog voltage differences to CMOS digital levels. As illustrated, the differential error amplifier 753 includes a comparator 754 that is clocked on its rising edge by two complementary clocks and resolves the difference between two differential signals on its input. For example, this process can occur at the falling edge (i.e., when CK="0"). In an embodiment, when CK="1", the outputs reset to VDDA. The latch 755 may be transparent when the digital levels are changed by the comparator 754 and 'locked' when the comparator 754 outputs reset to VDDA. In an embodiment, a flip flop 756 (e.g., a D flip flop) samples the output of the latch 755 on the rising edge. In an embodiment, a clock driver acts as a buffer which drives the comparator 754 with high slope clocks.

Figure 8:
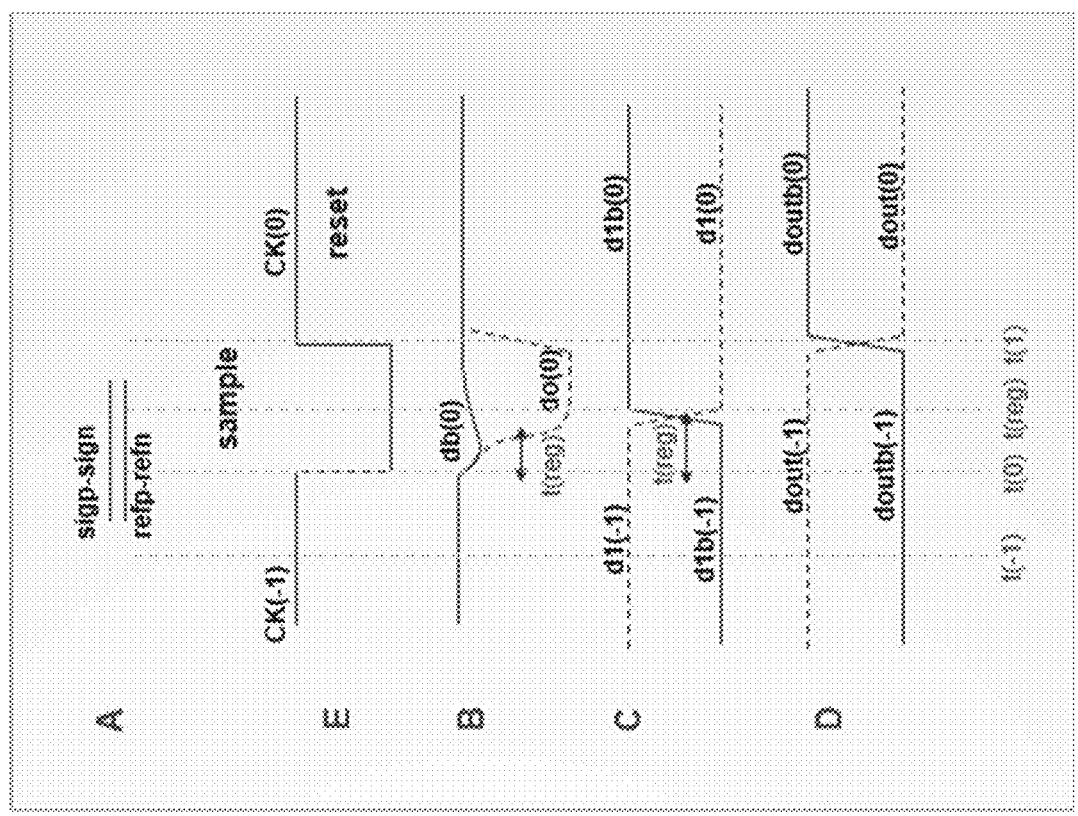
FIG. 8 is an example timing diagram corresponding to a comparator of a VADC, in accordance with at least some embodiments.

FIG. 8 is an example timing diagram corresponding to the various operational stages (e.g., stages A through E) of the comparator 754 of FIG. 7 of a VADC, in accordance with at least some embodiments. In an embodiment, as shown in FIGS. 7 and 8, stage E shows the two operation mode at the circuit: a sample mode and a reset mode. The sample mode is performed on the falling edge and is related to observation, integration, regeneration and hold time constants of the comparator 754. The reset mode can be performed on a rising edge and is related to "cleaning" data in the memory relating to previous decisions on the respective nodes of the comparator 754.

With reference to FIGS. 7 and 8, stage A illustrates a difference between two analog differential signals at the comparator's inputs. At time t(−1), clock cycle (CK−1) is in a reset phase where the comparator outputs are reset to VDDA. Stages C and D hold the digital value resolved at this cycle: d1(−1) at the latch 755 output and dout(−1) at the output of the flip flop 756.

At time t(0), the sampling phase is initiated, where two differential analog signals are ready at the comparator 754 inputs. During stage B (between t(0) and t(reg)), the comparator 754 observes, integrates and regenerates those analog values to digital levels. At time t(reg), after the falling edge, the comparator 754 makes a decision (end of stage B) on its inputs db(0). When the decision is made (e.g., a short time after t(reg)), the latch 755 changes its state to d1(0). At the rising edge of the clock (e.g., at the end of the sampling phase), the flip flop 756 samples the d1(0) signal and provides an output synchronized to the sampling clock.

FIG. 9 is a flow diagram of a method 900 of extracting one or more signal properties of a transmitted signal based on a set of valid samples identified by a VADC of a transmitter device in a communication system, in accordance with at least some embodiments. The method 900 can be performed by processing logic comprising hardware, software, firmware, or any combination thereof. In at least one embodiment, the method 900 is performed by the VADC 150 of FIGS. 1A and 1B, the VADC 250 of FIG. 2, the VADC 350 of FIG. 3, or the VADC 550 of FIG. 5. In at least one embodiment, the method 900 is performed by various components of the VADC 150, 250, 350, and 550 to identify the one or more signal properties to provide to control logic 220 configured to perform one or more DSP algorithms based on the one or more signal properties, according to embodiments. According to embodiments, the method 900 can be performed by a transmitter (e.g., a transmitter device in a communications system) having a VADC, in accordance with the embodiments described herein with reference to a transmitter-side VADC. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the VADC measures an analog output of a digital-to-analog converter (DAC) to identify a set of digital samples corresponding to a transmitted signal. In an embodiment, the VADC is a component of a transmitter including the DAC configured to generate the transmitted signal in the analog domain. In an embodiment, the VADC identifies a set of samples (in the digital domain) of the analog output of the DAC.

At operation 920, the VADC identifies, from the set of digital samples, a set of valid samples, where each valid sample has a voltage within a voltage range. In an embodiment, the VADC generates a first threshold voltage level (e.g., Vthreshold 1) and a second threshold voltage level (e.g., Vthreshold 2) to establish the voltage range for use in comparing a voltage of each of the set of digital samples. In an embodiment, Vthreshold 1 and Vthreshold 2 of the voltage range represent a 'window' for identifying the set (or sub-set) of valid samples. In an embodiment, when the analog signal crosses into the 'window', the corresponding sample is considered valid (e.g., the signal is valid when the signal's voltage value is known). In an embodiment, the values of Vthreshold 1 and Vthreshold 2 can be adjusted over time such that a first Vthreshold 1 and a first Vthreshold 2 are generated and applied at a first time, a second Vthreshold 1 and a second Vthreshold 2 are generated and applied at a second time, a third Vthreshold 1 and a third Vthreshold 2 are generated an and applied at a third time, and so on (e.g., as shown in FIG. 4). In an embodiment, as described above, the threshold voltages of the voltage range can be generated and based on historical data associated with the transmitted signal. For example, based on previous iterations of the scanning process performed by the VADC, historical data can be collected and one or more threshold voltage levels can be identified that correspond to high signal density areas in the amplitude domain. In an embodiment, the threshold voltages can be adjusted or set based on historical data relating to the transmitted signal identified during one or more "offline" signal analysis algorithms.

At operation 930, the VADC extracts one or more signal properties from the set of valid samples. In an embodiment, the one or more signal properties can include, but are not limited to, any property of the transmitted signal that can be used in a subsequent DSP algorithm (e.g., a calibration algorithm such as a TI-calibration processing, a system characterization processing, independent sampling phase processing, etc.). In an embodiment, example signal properties that can be identified based on the valid samples can include, but are not limited to, a first moment of the transmitted signal corresponding to a direct current level, a second moment of the transmitted signal corresponding to a power level, a cross-correlation property associated with a reference signal, an auto-correlation property, etc.

Figure 10:
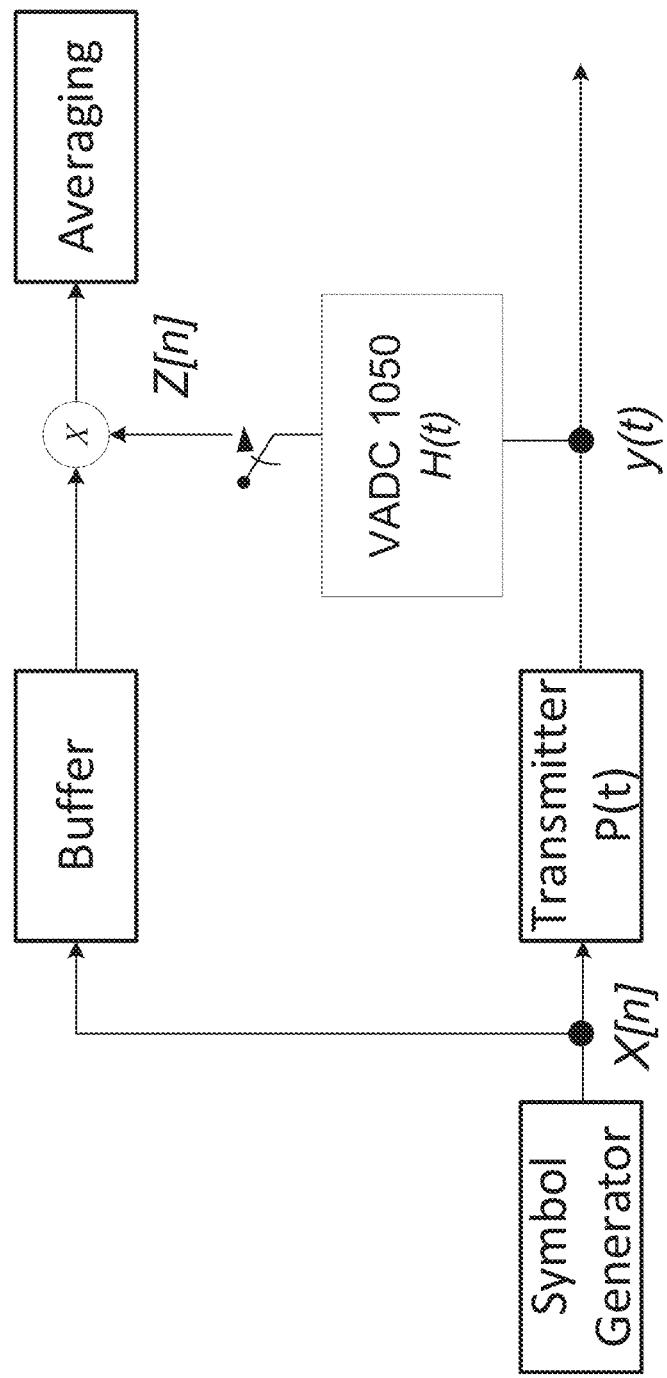
FIG. 10 is a block diagram of signal processing by a transmitter and a VADC, in accordance with at least some embodiments.

FIG. 10 is a block diagram of signal processing by a transmitter and a VADC 1050, in accordance with at least some embodiments. In an embodiment, the VADC 1050 identifies signal properties associated with the output (y(t)) of the transmitter (e.g., DAC 210 of FIG. 2). According to embodiments, based on the VADC 1050 output, the identified set of valid samples can be collected, and the signal properties of the analog output signal y(t) can be extracted. The valid samples can be further processed using one or more DSP-based algorithms, such as, for example, TI-skews calibration, system characterization and independent sampling phase for eye opening estimation.

In an embodiment, the valid samples are used in a TI-skew calibration process. One or more primary or main TI skews include offset, gain and phase. In an embodiment, offset and gain can be calibrated based on estimation of a first and second moment of the sampled signal. FIG. 6 illustrates a block diagram of an exemplary VADC 1050 configured to identify signal properties for further phase calibration processing. In an embodiment, a continuous DAC output signal y(t) can be represented as a convolution of digitally transmitted symbols (x[n]) and a continuous channel pulse response (CPR) (P(t)) as follow:

$$y(t) = \sum_{i=0}^{t} x[i]P(t - iT) \qquad \text{Equation 1}$$

where T is a unit-interval (UI).

Due to finite bandwidth (BW) of the VADC 1050, the VADC 1050 itself has a CPR, such that the VADC 1050 output can be represented as:

$$z[n] = z(nT + \varphi) = \int_{-\infty}^{\infty} y(\tau)H(nT + \varphi - \tau)d\tau = \qquad \text{Equation 2}$$

$$\int_{-\infty}^{\infty} \sum_{i=0}^{t} x[i]P(\tau - iT)H(nT + \varphi - \tau)d\tau =$$

$$\sum_{i=0}^{t} x[i] \int_{-\infty}^{\infty} P(\tau - iT)H(nT + \varphi - \tau)d\tau =$$

$$\sum_{i=0}^{t} x[i]Q((n + i)T + \varphi)$$

where H(t) is the CPR of the VADC 1050, Q(t) is the equivalent CPR between the symbol generator and the VADC 1050 output, and φ is the phase delay that enables sampling of the continuous signal at different phases.

In an embodiment, under the assumption of independent and identical distribution (i.i.d.) of transmitted symbols, the correlation between the transmitted symbol and the VADC 1050 output gives the CPR at a specific delay according to the following expression:

$$E[x[n] \cdot z[i]] = E\left[x[n]\sum_{i=0}^{t} x[i]Q((k + i)T + \varphi)\right] = \qquad \text{Equation 3}$$

$$\sum_{i=0}^{t} E[x[n]x[i]] \cdot Q(iT + \varphi) =$$

$$\sum_{i=0}^{t} \sigma_x^2 \delta(n - i) \cdot Q(iT + \varphi) = \sigma_x^2 Q(nT + \varphi)$$

where $\sigma_x^2$ is the transmitted symbol power.

In an embodiment, using a single sample (z[i]) of the VADC 1050 output and multiple transmitted symbols (x[n], n∈{0 ... N}), the discrete CPR (Q(nT+φ), n∈{0 ... N}) can be measured.

In addition, using different phases (φ), the continuous CPR is measured. Due to the fact that the transmitted symbols are i.i.d., and under the assumption that the system's statistical properties are quasi-static, a determination can be made that the system is stationary in the first moment, according to the following expression:

$$E[xz_k] \to E[xz], \forall z_k \in z \qquad \text{Equation 4:}$$

where $z_k$ is the sub-sequence of the VADC's output full-sequence z. Thus, the CPR can be estimated using any of the VADC 1050 output samples, even random or sub-sampled sequences of the VADC 1050 output can be used due to invalid samples.

In an embodiment, due to the correlation being used with the first moment of the samples (z[i]), the CPR estimation is an unbiased detector. In an embodiment, the VADC 1050 is configured to "drop" the invalid samples such that those samples do not affect the CPR processing. In an embodiment, noise in the system can be detected as white noise.

According to embodiments, the above-described TI skew phase calibration processing can be based on the VADC 1050 output signal being synchronized with the transmitted signal. In an embodiment, due to unknown delay in the transmitter and VADC 1050, a further synchronization process can be performed to synchronize the transmitter signal and the VADC output signal, as described in greater detail below with reference to FIGS. 12-16.

Figure 11:
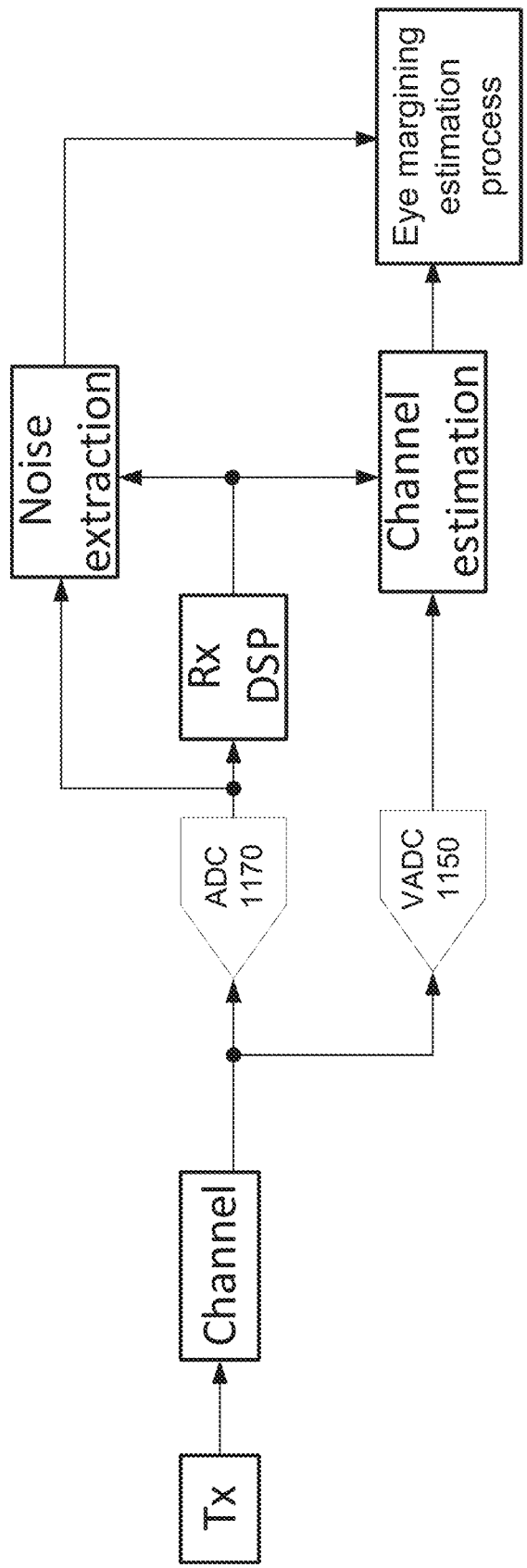
FIG. 11 is a block diagram for executing eye margining estimation based on one or more signal properties identified by a VADC, in accordance with at least some embodiments.

FIG. 11 is a block diagram for executing eye margining estimation based on one or more signal properties identified by a VADC, in accordance with at least some embodiments. In an embodiment, the VADC 1150 can be used for eye opening estimation by estimating the sensitivity for voltage noise (e.g., thermal noise) and for timing noise (e.g., clock instability). In an embodiment, use of the VADC 1150 (e.g., on a receiver device coupled to a transmitter (Tx) via a channel) for eye opening estimation can be used in accordance with one or more communication standards, such as, for example, PCIe. In an embodiment, to measure the timing sensitivity, the transmitted signal should be sampled at some phases. However, a primary or main ADC 1170 may be locked on a specific phase defined by a clock-and-data recovery (CDR) process. In an embodiment, applying the stationarity assumption with the VADC 1150 extracting statistical properties, the VADC 1150 output can be used for CPR estimation (e.g., at the new phase) which, in turn, can be used for eye margining estimation, in accordance with FIG. 11.

Figure 12:
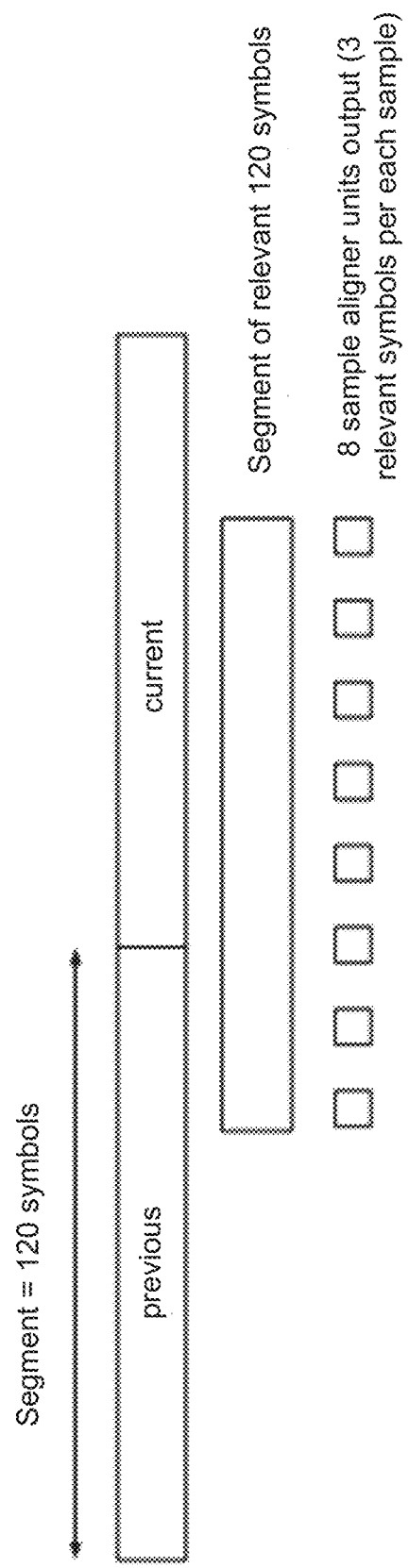
FIG. 12 illustrates an example signal dividing scheme relating to synchronization of an output of a VADC and a transmitted signal, in accordance with at least some embodiments.

FIG. 12 illustrates an example signal dividing scheme relating to a synchronization process executable by a VADC (e.g., a module or component of the VADC) to synchronize an output of a VADC and a transmitted signal, in accordance with at least some embodiments. According to embodiments, a clocking scheme can be implemented to enable synchronization of the transmitted signal and the output of the VADC. In an embodiment, there are several clocks in the system, all of which are generated relative to a reference clock at a reference rate (e.g., Fs/340, where Fs is the symbol frequency). In an embodiment, first, the DAC (e.g., DAC 210 of FIG. 2) is fed with a clock of rate Fs/the number of sub-DACs. In an embodiment, the VADC can sample at a rate that is slower than the baud rate. In an embodiment, the ratio between the baud rate and the VADC sampling rate can be set to an odd number, such that each of the sub-DACs (e.g., 4 sub-DACs) samples can be identified and distinguished from one another. For example, the ratio between the baud rate and the VADC sampling rate can be 15. In an embodiment, at the output of the VADC, there may be a serial in parallel out (SIPO) block that operates at a rate which is slower by a predefined factor (e.g., 8), thereby resulting in a rate of Fs/120. In an embodiment, the digital domain portions of FIG. 15 (described below) operate at the Fs/120 rate in order to have the same number of samples (e.g., 8 samples at the output of the SIPO) at each clock, otherwise there is an arbitrary number of samples per segment of, for example, 40 symbols (e.g., 3,3,2). It is noted that a segment may have any suitable number of symbols (e.g., 20 symbols, 30 symbols, 40 symbols, 50 symbols, etc.). In an embodiment, the ratio between the baud rate and the VADC sampling rate can be set to an odd number, such that each of the sub-DACs (e.g., 4 sub-DACs) samples can be identified and distinguished from one another, i.e. the ratio and the number of sub-DACs should have a greatest common divisor equal 1. For example, the ratio between the baud rate and the VADC sampling rate can be 15.

In an embodiment, the synchronization process is executed to manage symbols $s_n$ passing through a system with delay x to identify samples $r_n$. In an embodiment, delay x is known up to a ±1.5 UI range (e.g., due to analog uncertainty at the DAC and VADC). In an embodiment, synchronization is performed for the channel estimation (e.g., using DAC timing calibration by cross-correlation of the samples and symbols), otherwise the outcome of the cross-correlation is zero. In an embodiment, the delay may be composed of an integer part and modulo residue (e.g., when dividing by 120 (the new segment length), according to the new rate of the calibration blocks Fs/120, in accordance with the following expression:

$$\hat{x} = \text{new length segment} \cdot y + k \qquad \text{Equation 5}$$

where y defines a sync buffer, $$y = \text{floor}\left(\frac{\hat{x}}{\text{new length segment}}\right),$$

and k defines mapping and relevant skew to align corresponding samples and symbols.

As shown in FIG. 12, two segments (a current segment and a previous segment) are accumulated in order to have all relevant symbols for alignment for correlation in a time error detector (TED).

Figure 13:
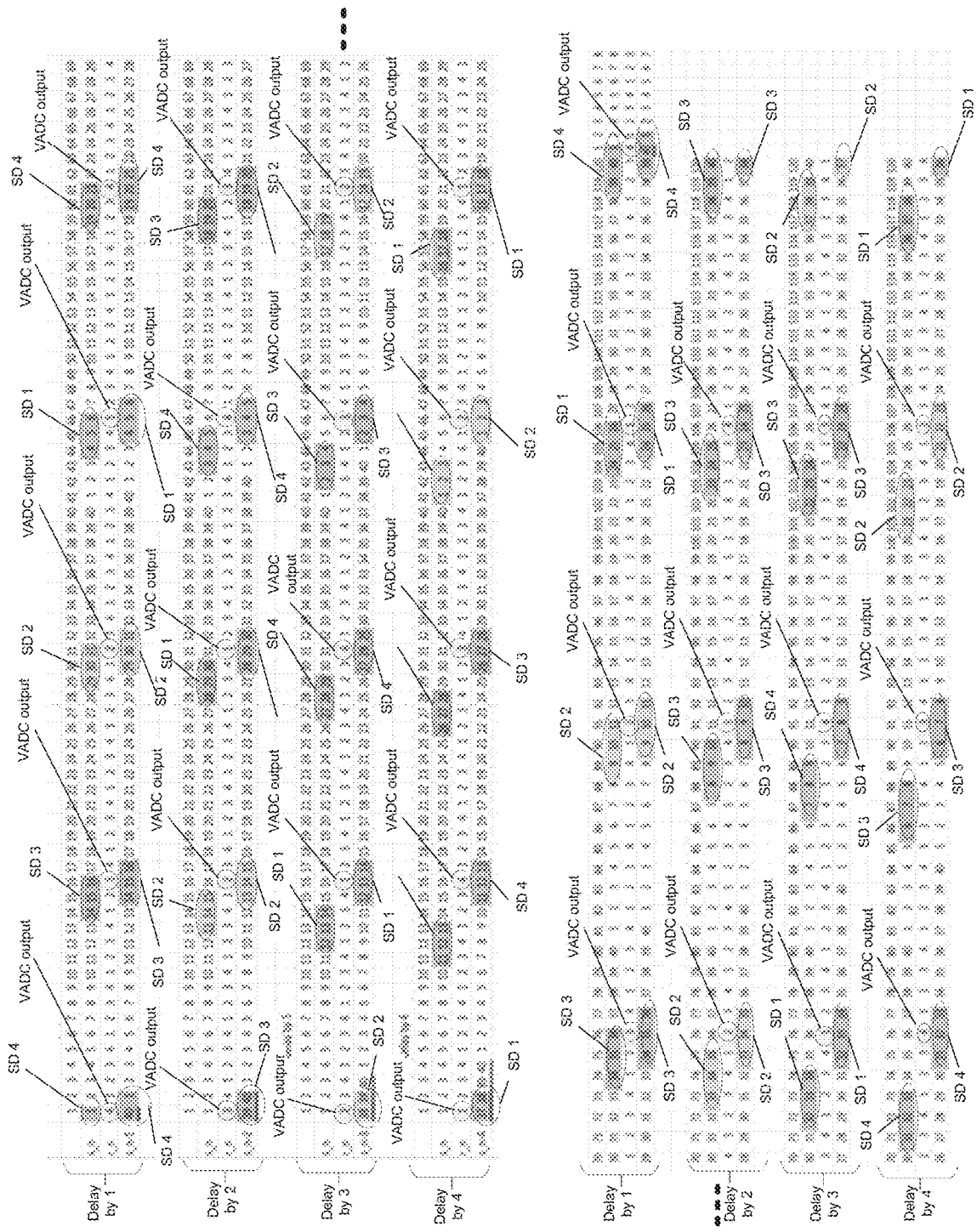
FIG. 13 illustrates an example alignment table associated with synchronization of an output of a VADC and a transmitted signal, in accordance with at least some embodiments.
Figure 14A:
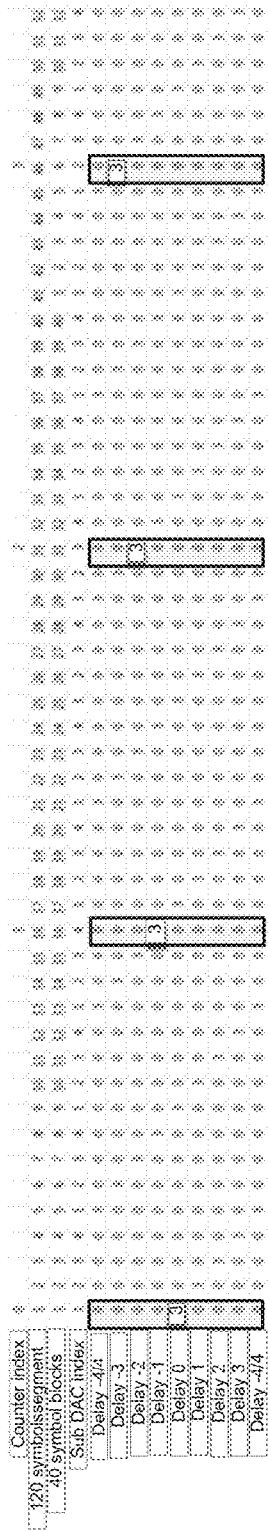
FIG. 14A illustrates an example alignment table relating to a calibration wake-up sequence associated with determining an uncertainty in processing time of an analog portion of synchronization processing of an output of a VADC and a transmitted signal, in accordance with at least some embodiments.
Figure 14B:
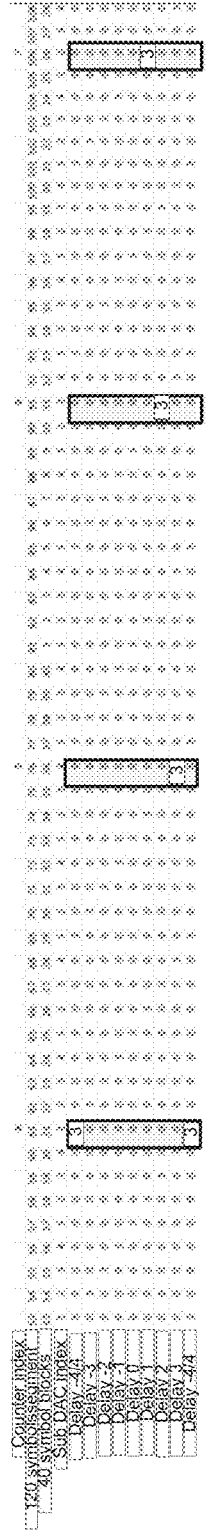
FIG. 14B illustrates an example index of valid samples identified by a VADC to a corresponding delay level, in accordance with at least some embodiments.

FIGS. 13, 14A, and 14B illustrates example alignment tables corresponding to a segment of 120 samples, including VADC output samples aligned with the output of each of the sub-DACs (e.g., SD 1, SD 2, SD 3, and SD 4), in accordance with an associated delay (e.g., delay by 1 UI, delay by 2 UI, delay by 3 UI, delay by 4 UI).

FIG. 13 illustrates an example alignment table associated with synchronization of an output of a VADC and a transmitted signal, in accordance with at least some embodiments. In an embodiment, a calibration wake-up sequence may be performed to determine the uncertainty in the processing time of the analog signal. For this procedure, a known and defined 8-periodic series may be employed. First, a synchronization (sync) buffer is set with y, which is the integer part of dividing the assumed delay by the new length segment (e.g., 120). In an embodiment, k (i.e., the mapping and relevant skew to align corresponding samples and symbols) is set as follows:

$$k = \text{mod}(\text{delay}, \text{new length segment}) - \text{max delay} \qquad \text{Equation 6}$$

where, for example, a maximum delay supported by the periodic 8 series is 4 (e.g., max delay=4). In an embodiment, the series is selected to be periodic 8 because for a sampling rate which is divided by 15 it is optimal since it is also periodic 120. In an embodiment, a series of input values are applied at the DAC input with period 8: "3,0,0,0,0,0,0,0"

(e.g., Vdd and 7 other symbols that have a value that is the furthest from the single symbol (e.g., Vdd) to be identified to minimize detection errors), such that sub-DAC 1 is used (e.g., where the DAC includes 4 sub-DACs: sub-DAC 1 or SD 1, sub-DAC 2 or SD 2, sub-DAC 3 or SD 3, and sub-DAC 4 or SD 4). In an embodiment, the slicer thresholds of the VADC are set to the corresponding level. For example, in each segment of 120 samples, the 8 available samples at the SIPO output are in the same position.

FIG. 14A illustrates an example alignment table relating to a calibration wake-up sequence associated with determining an uncertainty in processing time of an analog portion of synchronization processing of an output of a VADC and a transmitted signal, in accordance with at least some embodiments. As shown in FIG. 14A (e.g., an alignment table corresponding to the calibration wake-up sequence), in each segment of 120 samples, only one of the 8 samples available at the SIPO output is valid.

FIG. 14B illustrates an example index of valid samples identified by a VADC to a corresponding delay level, in accordance with at least some embodiments. As shown in FIG. 14B, the index of the valid sample defines the corresponding skew that is needed. For example, as shown in FIG. 14B, if r_0 is valid, then it is determined that 0 delay occurred. In another example, as shown in FIG. 14B, if r_7 is valid, then it is determined that the delay is 1 UI.

Figure 15:
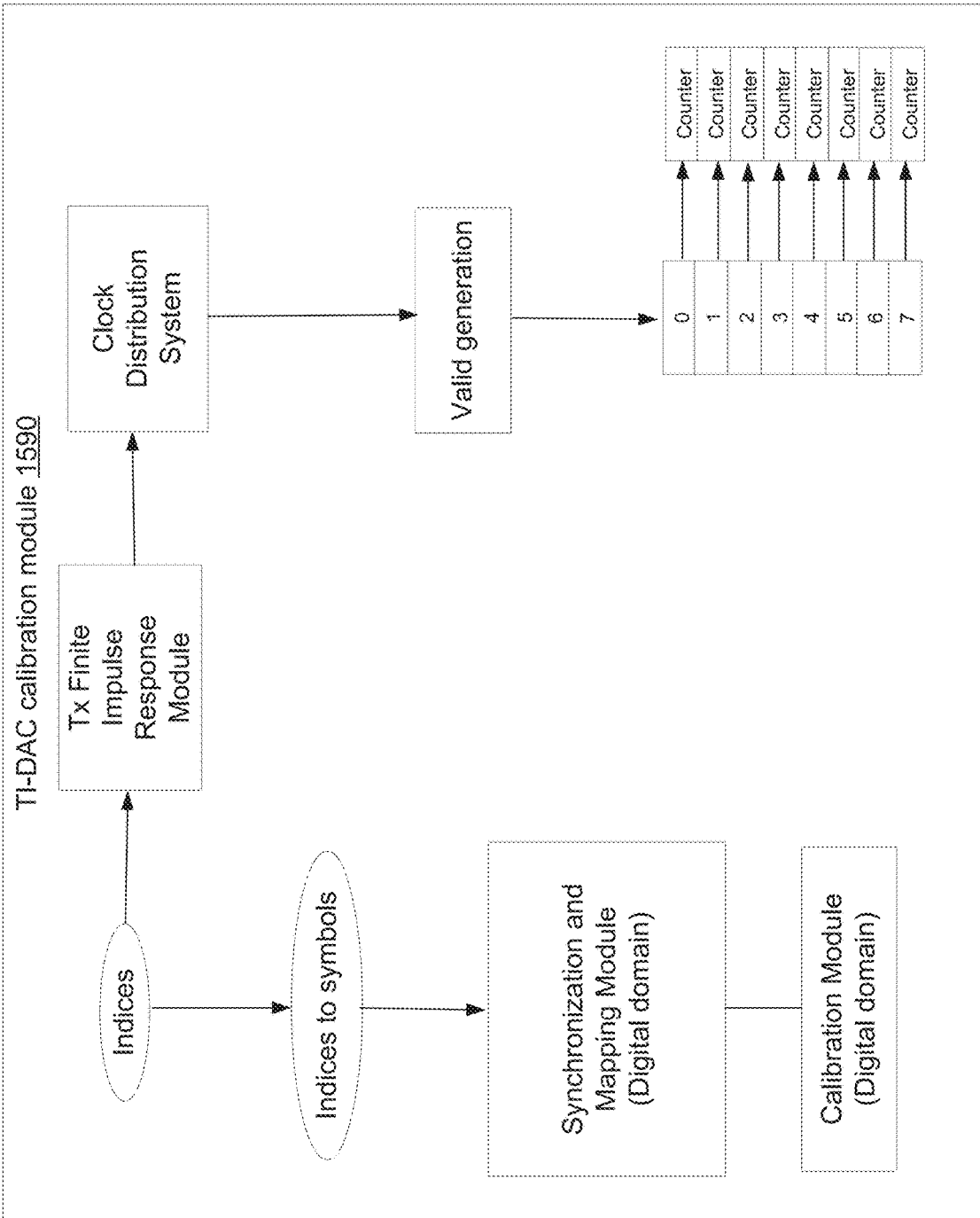
FIG. 15 illustrates a block diagram corresponding to TI-DAC timing calibration processing, in accordance with at least some embodiments.

FIG. 15 illustrates a block diagram corresponding to an example TI-DAC calibration module 1590 configured to perform timing calibration processing based on samples and signal properties identified by a VADC, in accordance with at least some embodiments. In an embodiment, to avoid false alarms due to noisy measurements, statistics can be collected from more than one segment.

In an embodiment, as shown in FIGS. 15, 16A, and 16B, 8 counters can be employed with a synchronized reset over a valid flag of the 8 samples at the output of the SIPO at the output of the VADC (e.g., to generate a histogram). In an embodiment, 8 counters are used to correspond to the 8 samples at the output of the SIPO because the rate of the clock there is slower by a predefined factor (e.g., 8). In an embodiment, the use of 8 samples or 8 counters is based on the predefined factor (e.g., 8) that slows the clock.

Figure 16A:
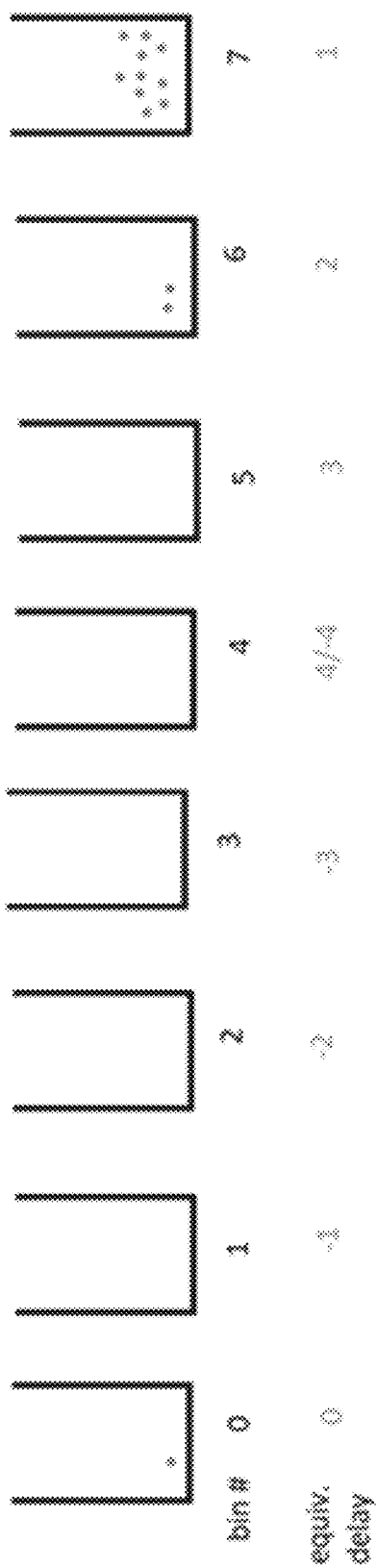
FIG. 16A illustrates an example wake-up sequence corresponding to synchronization with multiple counters filling, in accordance with at least some embodiments.
Figure 16B:
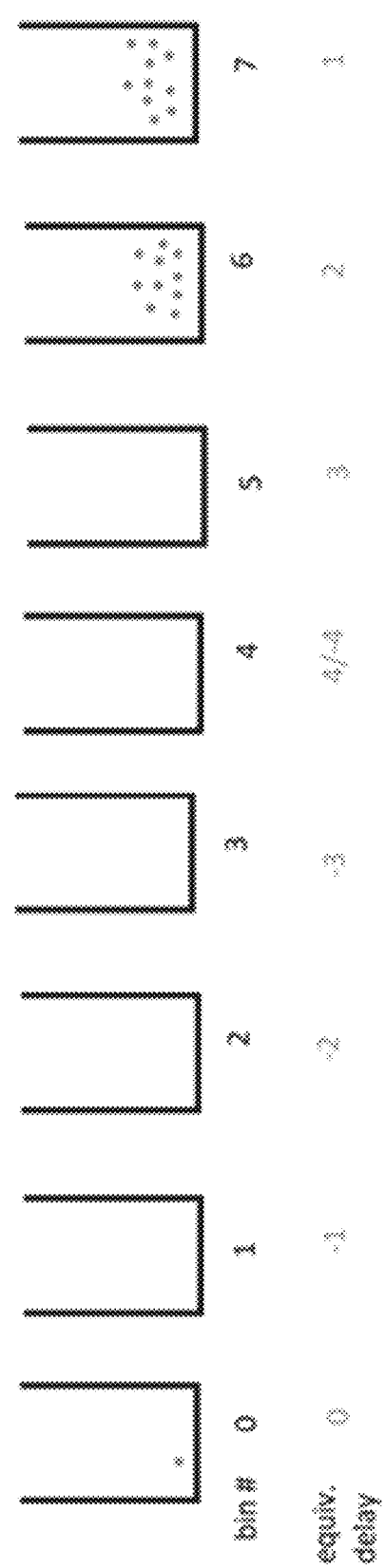
FIG. 16B illustrates an example wake-up sequence corresponding to synchronization with multiple counters filling and multiple high counters, in accordance with at least some embodiments.

The output of the counter can be kept in registers and be accessible by firmware confirmed to determine the index of the valid sample by the index of the counter with the maximum result. For example, if the delay is 0.5 UI, then it may be determined that two bins may be high (e.g., as shown in FIG. 16B) or determined that no one bin may cross a certain threshold. FIG. 16A illustrates an example wake-up sequence corresponding to synchronization with multiple counters filling, in accordance with at least some embodiments. FIG. 16B illustrates an example wake-up sequence corresponding to synchronization with multiple counters filling and multiple high counters, in accordance with at least some embodiments.

In an embodiment, the sampling point may influence the height of the sample, and thus it may not be detected by the slicer threshold set for the VADC. In that case, the processing can wait a predefined time, and if no bin is above a predefined threshold following the waiting period, the processing can move the sampling point of the VADC. In an embodiment, the counters may also be reset at that point. This can be repeated until one of the bins is above the predefined threshold, and the corresponding skew is identified. In an embodiment, the sampling point of the VADC is the analog delay which is more sensitive and has a higher resolution.

In an embodiment, an example a VADC can initiate wake-up sequence process (e.g., a calibrated VADC) configured to operate in a sampling mode where one or more valid samples are identified for use in extracting one or more signal properties associated with a transmitted signal. In an embodiment, the transmitted signal can be outputted by a DAC having a periodic symbol sequence (e.g., 3,0,0,0,0,0, 0,0). As noted above, the periodic symbol sequence includes a single symbol value (e.g., 3) and 7 other symbols that have a value that is furthest in value from the symbol value to be identified to minimize detection errors. For example, the 7 other symbols can have a value of 0 or −3. In an embodiment, the threshold values of the voltage range used to identify valid samples may be set to a maximum supported value. In an embodiment, a sampling phase (SP) of the VADC can be set to an initial value (e.g., −0.5 UI). The valid sample counters (e.g., counters 0 to 7 of FIGS. 15, 16A, and 16B) can be reset and activated with a counter threshold level (e.g., a threshold level of 128). A wait period can be introduced (e.g., a wait of approximately 100 nsec) after which the counters are read. A determination is made whether one or more counters have a count that exceeds the counter threshold level. If one or more counters exceeds the counter threshold level, the skew is set, and the sub-DACs are mapped using a maximum counter index. At this stage of the processing, once the skew is set, the digital synchronization of the transmitted signal and the valid samples is complete.

In an embodiment, if a determination is made that no counter exceeds the threshold level, the sampling phase of the VADC can be increased by a set amount (e.g., 0.1 UI). If the total sampling phase of the VADC is less than a predefined level (e.g., 0.5 UI), the above-identified processing can be repeated such that the valid sample counters are reset and activated. This is again followed by a waiting of the predefined interval (e.g., 100 nsec) and a reading of the counters to determine if one or more counters exceed the counter threshold level. In an embodiment, if the sampling phase of the VADC exceeds the predefined level (e.g., 0.5 UI), the counter threshold level is adjusted (e.g., the counter threshold level is decreased by 1 LSB). Following the adjustment of the counter threshold level, the process can return to the setting of the sample phase of the VADC, followed by the repeating of the reading of the counters to determine if a counter is identified that exceeds the updated counter threshold level. In an embodiment, the process continues until a counter has a maximum counter index that exceeds the counter threshold level, and the corresponding skew and sub-DAC mapping is set, thereby completing the digital synchronization processing.

Figure 17:
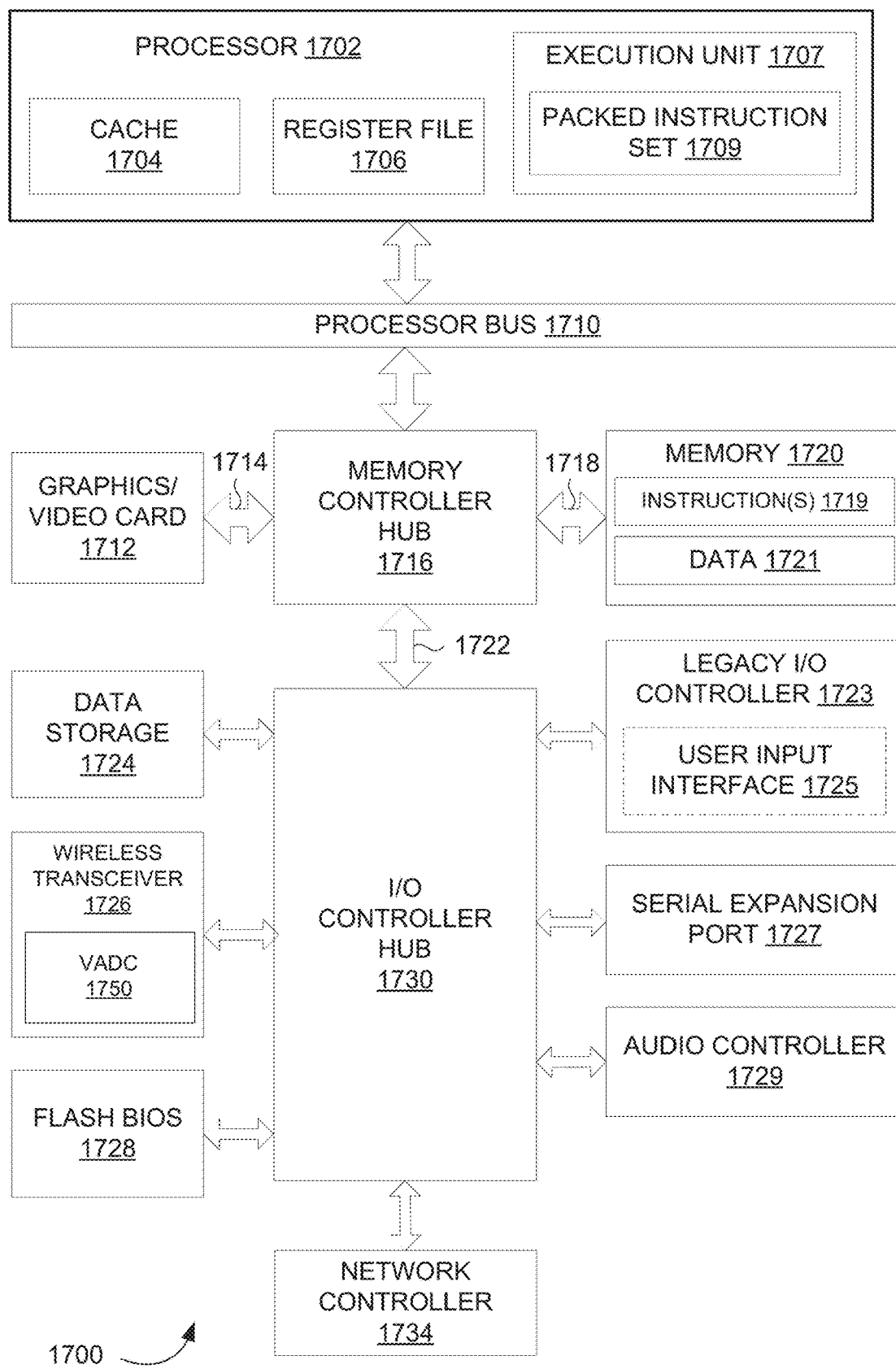
FIG. 17 illustrates an example computer system including a wireless transceiver including a VADC, in accordance with at least some embodiments.

FIG. 17 illustrates a computer system 1700, in accordance with at least one embodiment. In at least one embodiment, computer system 1700 may be a system with interconnected devices and components, an SOC, or some combination. In at least one embodiment, computer system 1700 is formed with a processor 1702 that may include execution units to execute an instruction. In at least one embodiment, computer system 1700 may include, without limitation, a component, such as processor 1702, to employ execution units including logic to perform algorithms for processing data. In at least one embodiment, computer system 1700 may include processors, such as PENTIUM® Processor family, Xeon™, Itanium®, XScale™ and/or StrongARM™, Intel® Core™, or Intel® Nervana™ microprocessors available from Intel Corporation of Santa Clara, Calif., although other systems (including PCs having other microprocessors, engineering workstations, set-top boxes and like) may also be used. In at least one embodiment, computer system 1700 may execute a version of WINDOWS' operating system available from Microsoft Corporation of Redmond, Wash., although other operating systems (UNIX and Linux for example), embedded software, and/or graphical user interfaces may also be used.

In at least one embodiment, computer system 1700 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 1700 may be used in devices such as graphics processing units (GPUs), network adapters, central processing units and network devices such as switch (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 1700 may include, without limitation, processor 1702 that may include, without limitation, one or more execution units 1707 that may be configured to execute a Compute Unified Device Architecture ("CUDA") (CUDA® is developed by NVIDIA Corporation of Santa Clara, Calif.) program. In at least one embodiment, a CUDA program is at least a portion of a software application written in a CUDA programming language. In at least one embodiment, computer system 1700 is a single processor desktop or server system. In at least one embodiment, computer system 1700 may be a multiprocessor system. In at least one embodiment, processor 1702 may include, without limitation, a CISC microprocessor, a RISC microprocessor, a VLIW microprocessor, a processor implementing a combination of instruction sets, or any other processor device, such as a digital signal processor, for example. In at least one embodiment, processor 1702 may be coupled to a processor bus 1710 that may transmit data signals between processor 1702 and other components in computer system 1700.

In at least one embodiment, processor 1702 may include, without limitation, a Level 1 ("L1") internal cache memory ("cache") 1704. In at least one embodiment, processor 1702 may have a single internal cache or multiple levels of internal cache. In at least one embodiment, cache memory may reside external to processor 1702. In at least one embodiment, processor 1702 may also include a combination of both internal and external caches. In at least one embodiment, a register file 1706 may store different types of data in various registers including, without limitation, integer registers, floating point registers, status registers, and instruction pointer register.

In at least one embodiment, execution unit 1707, including, without limitation, logic to perform integer and floating point operations, also resides in processor 1702. Processor 1702 may also include a microcode ("ucode") read only memory ("ROM") that stores microcode for certain macro instructions. In at least one embodiment, execution unit 1707 may include logic to handle a packed instruction set 1709. In at least one embodiment, by including packed instruction set 1709 in an instruction set of a general-purpose processor 1702, along with associated circuitry to execute instructions, operations used by many multimedia applications may be performed using packed data in a general-purpose processor 1702. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, an execution unit may also be used in microcontrollers, embedded processors, graphics devices, DSPs, and other types of logic circuits. In at least one embodiment, computer system 1700 may include, without limitation, a memory 1720. In at least one embodiment, memory 1720 may be implemented as a DRAM device, an SRAM device, flash memory device, or other memory devices. Memory 1720 may store instruction(s) 1719 and/or data 1721 represented by data signals that may be executed by processor 1702.

In at least one embodiment, a system logic chip may be coupled to processor bus 1710 and memory 1720. In at least one embodiment, the system logic chip may include, without limitation, a memory controller hub ("MCH") 1716, and processor 1702 may communicate with MCH 1716 via processor bus 1710. In at least one embodiment, MCH 1716 may provide a high bandwidth memory path 1718 to memory 1720 for instruction and data storage and for storage of graphics commands, data and textures. In at least one embodiment, MCH 1716 may direct data signals between processor 1702, memory 1720, and other components in computer system 1700 and to bridge data signals between processor bus 1710, memory 1720, and a system I/O 1722. In at least one embodiment, a system logic chip may provide a graphics port for coupling to a graphics controller. In at least one embodiment, MCH 1716 may be coupled to memory 1720 through high bandwidth memory path 1718, and graphics/video card 1712 may be coupled to MCH 1716 through an Accelerated Graphics Port ("AGP") interconnect 1714.

In at least one embodiment, computer system 1700 may use system I/O 1722 that is a proprietary hub interface bus to couple MCH 1716 to I/O controller hub ("ICH") 1730. In at least one embodiment, ICH 1730 may provide direct connections to some I/O devices via a local I/O bus. In at least one embodiment, a local I/O bus may include, without limitation, a high-speed I/O bus for connecting peripherals to memory 1720, a chipset, and processor 1702. Examples may include, without limitation, an audio controller 1729, a firmware hub ("flash BIOS") 1728, a wireless transceiver 1726, a data storage 1724, a legacy I/O controller 1723 containing a user input interface 1725 and a keyboard interface, a serial expansion port 1727, such as a USB, and a network controller 1734. Data storage 1724 may comprise a hard disk drive, a floppy disk drive, a CD-ROM device, a flash memory device, or other mass storage device. In an embodiment, the wireless transceiver 1726 includes a VADC 1750 (e.g., the VADC 150, 250, 350, and 550 of FIGS. 1A, 1B, 2, 3, and 5, respectively).

In at least one embodiment, FIG. 17 illustrates a system, which includes interconnected hardware devices or "chips." In at least one embodiment, FIG. 17 may illustrate an exemplary SoC. In at least one embodiment, devices illustrated in FIG. 17 may be interconnected with proprietary interconnects, standardized interconnects (e.g., PCIe), or some combination thereof. In at least one embodiment, one or more components of system 1700 are interconnected using compute express link ("CXL") interconnects.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A transmitter comprising:
    a digital-to-analog converter (DAC) to generate an analog output corresponding to a transmitted signal; and
    an analog-to-digital converter (ADC) coupled to the DAC, the ADC to:
        measure the analog output of the DAC to identify a set of digital samples;
        identify, from the set of digital samples, a set of valid samples, wherein each valid sample has a voltage within a voltage range; and
        extract one or more signal properties from the set of valid samples.

2. The transmitter of claim 1, further comprising digital logic to:
    receive the one or more signal properties from the ADC;
    conduct signal processing relating to the transmitted signal based on the one or more signal properties to generate one or more control signals; and
    provide the one or more control signals to the DAC, wherein the DAC calibrates the transmitted signal based on the one or more control signals.

3. The transmitter of claim 1, wherein the ADC comprises a voltage generator to generate a minimum voltage threshold level and a maximum voltage threshold level of the voltage range.

4. The transmitter of claim 3, wherein the ADC comprises:
    a first data detector coupled to the voltage generator, wherein the first data detector generates a first detected value based on a first comparison of a voltage level of a digital sample of the set of digital samples to the minimum voltage threshold level; and
    a second data detector coupled to the voltage generator, wherein the second data detector generates a second detected value based on a second comparison of the voltage level of the digital sample of the set of digital samples to the maximum voltage threshold level, wherein the digital sample is identified as a valid sample based on the first detected value and the second detected value.

5. The transmitter of claim 3, the voltage generator to:
    generate a first voltage range comprising a first minimum voltage threshold level and a first maximum voltage threshold level, wherein a first voltage level of a first digital sample measured at a first time is compared to the first voltage range to determine if the first digital sample is a first valid sample of the set of valid samples; and
    generate a second voltage range comprising a second minimum voltage threshold level and a second maximum voltage threshold level, wherein a second voltage level of a second digital sample measured at a second time is compared to the second voltage range to determine if the second digital sample is a second valid sample of the set of valid samples.

6. The transmitter of claim 1, further comprises control logic to:
    receive the one or more signal properties from the ADC;
    conduct signal processing relating to the transmitted signal based on the one or more signal properties to generate one or more calibration controls; and
    provide the one or more calibration controls to the DAC, wherein the DAC calibrates the transmitted signal based on the one or more calibration controls.

7. The transmitter of claim 6, wherein the signal processing comprises one or more of a time-interleaved calibration processing, system characterization processing, or independent sampling phase processing.

8. The transmitter of claim 1, wherein the one or more signal properties extracted from the set of valid samples comprise one or more of a first moment of the transmitted signal corresponding to a direct current level, a second moment of the transmitted signal corresponding to a power level, a cross-correlation property associated with a reference signal, or an auto-correlation property.

9. The transmitter of claim 1, the ADC to synchronize a first timing associated with the transmitted signal with a corresponding timing of each of the set of digital samples.

10. The transmitter of claim 1, wherein the set of digital samples are measured at a plurality of times within a time period; and wherein a voltage level of each digital sample is compared to a corresponding voltage range associated with a respective time of the plurality of times to identify the set of valid samples.

11. The transmitter of claim 1, wherein the voltage range comprises a first threshold voltage level and a second threshold voltage level determined based at least in part on historical data associated with the transmitted signal.

12. A circuit comprising:
   a reference voltage generating digital-to-analog converter (DAC) to generate a first threshold voltage level and a second threshold voltage level of a voltage range;
   a first data detector coupled to the reference voltage generating DAC, wherein the first data detector generates a first detected value based on a first comparison of a voltage of a digital sample of a set of digital samples corresponding to a transmitted signal to a first threshold; and
   a second data detector coupled to the reference voltage generating DAC, wherein the second data detector generates a second detected value based on a second comparison of the voltage of the digital sample to a second voltage threshold level, wherein the digital sample is identified as a valid sample based on the first detected value and the second detected value.

13. The circuit of claim 12, further comprising a module configured to identify one or more signal properties based at least in part on the valid sample.

14. The circuit of claim 13, wherein the one or signal properties comprise one or more of a first moment of the transmitted signal corresponding to a direct current level, a second moment of the transmitted signal corresponding to a power level, a cross-correlation property associated with a reference signal, or an auto-correlation property.

15. The circuit of claim 13, wherein the one or more signal properties are provided by the circuit to digital logic configured to execute one or more digital signal processing algorithms.

16. The circuit of claim 15, wherein the one or more digital signal processing algorithms comprise one or more of a time-interleaved calibration processing, system characterization processing, or independent sampling phase processing.

17. The circuit of claim 15, wherein the one or more digital signal processing algorithms comprise a calibration algorithm configured to calibrate one or more of a gain, an offset, or a phase of the transmitted signal.

18. The circuit of claim 12, wherein following generation of the first threshold voltage level and the second threshold voltage level of the voltage range, the reference voltage generating DAC generates a third threshold voltage level and a fourth threshold voltage level of a further voltage range used to identify another valid sample.

19. The circuit of claim 12, further comprising a module to synchronize a first timing associated with the transmitted signal with a corresponding timing of the digital sample.

20. A method comprising:
   generating a first threshold voltage level and a second threshold voltage level of a voltage range;
   generating a first detected value based on a first comparison of a voltage of a digital sample of a set of digital samples corresponding to a transmitted signal to a first threshold;
   generating a second detected value based on a second comparison of the voltage of the digital sample to a second voltage threshold level, wherein the digital sample is identified as a valid sample based on the first detected value and the second detected value; and
   extracting one or more signal properties from the set of valid samples, wherein the one or more signal properties are processing in accordance with a digital signal processing algorithm.

* * * * *